(12) United States Patent
Shigemura et al.

(10) Patent No.: US 9,496,823 B2
(45) Date of Patent: Nov. 15, 2016

(54) FAULT DIAGNOSIS SYSTEM, FAULT DIAGNOSIS DEVICE, FAULT DIAGNOSIS METHOD, PROGRAM, COMPUTER-READABLE MEDIUM, AND DEVICE UNDER TEST

(75) Inventors: Toshiyuki Shigemura, Fukuoka (JP); Shigenori Matsuo, Fukuoka (JP); Hiroyuki Yamashita, Fukuoka (JP); Hiroshi Date, Fukuoka (JP)

(73) Assignee: System JD Co., Ltd., Fukuoka (JP)

( * ) Notice: Subject to any disclaimer, the term of this patent is extended or adjusted under 35 U.S.C. 154(b) by 423 days.

(21) Appl. No.: 14/125,145

(22) PCT Filed: Jun. 5, 2012

(86) PCT No.: PCT/JP2012/064480
§ 371 (c)(1),
(2), (4) Date: Dec. 10, 2013

(87) PCT Pub. No.: WO2012/169496
PCT Pub. Date: Dec. 13, 2012

(65) Prior Publication Data
US 2014/0117999 A1    May 1, 2014

(30) Foreign Application Priority Data
Jun. 10, 2011    (JP) .................................. 2011-129766

(51) Int. Cl.
*H02S 50/10* (2014.01)
*G01R 31/11* (2006.01)

(52) U.S. Cl.
CPC ............... *H02S 50/10* (2014.12); *G01R 31/11* (2013.01)

(58) Field of Classification Search
CPC ........ G01R 31/08; G01R 31/11; H02S 50/10
USPC .................. 324/534, 512, 533, 532
See application file for complete search history.

(56) References Cited

U.S. PATENT DOCUMENTS

| 5,376,888 A * | 12/1994 | Hook | ........... G01R 27/06 324/533 |
| 2016/0061881 A1 * | 3/2016 | Zhang | ........... G01R 31/129 361/21 |

FOREIGN PATENT DOCUMENTS

| JP | 2008-091828 | 4/2008 |
| JP | 2009-021341 | 1/2009 |

(Continued)

OTHER PUBLICATIONS

International Search Report dated Jul. 17, 2012 filed in PCT/JP2012/064480.

(Continued)

*Primary Examiner* — Christopher Mahoney
(74) *Attorney, Agent, or Firm* — Rankin, Hill & Clark LLP

(57) ABSTRACT

A fault diagnosis method utilizing a fault diagnosis system for diagnosing a photovoltaic module by estimating a fault location, the fault diagnosis system including a signal generator for generating and inputting an input signal into a positive terminal or a negative terminal of the photovoltaic module, a waveform observer for observing a reflected output signal from an open end or the fault location, a diagnosis unit for estimating the fault location based on the output signal, a conductive body, and an alignment unit for controlling the positions of the conductive body and/or the photovoltaic module. The diagnosis method includes controlling the positions of the conductive body and/or the photovoltaic module, observing the output signal of the input signal, and estimating the fault location based on two reflected output signals of input signals inputted into the positive terminal and the negative terminal of the photovoltaic module.

19 Claims, 12 Drawing Sheets

(56) References Cited

FOREIGN PATENT DOCUMENTS

| JP | 2009-032743 | 2/2009 |
| JP | 2011-035000 | 2/2011 |
| JP | 2011-124401 | 6/2011 |

OTHER PUBLICATIONS

Extended European Search Report dated Sep. 2, 2015 issued in the corresponding European patent application No. 12797621.5.
Takashima T et al., "Experimental studies of fault location in PV module strings", Solar Energy Materials and Solar Cells, Elsevier Science Publishers, Amsterdam, NL vol. 93, No. 6-7, Jun. 1, 2009, pp. 1079-1082.; in Extended European Search Report.
Takumi Takashima et al., "Experimental Studies of Failure Detection Methods in PV Module Strings", Conference Record of the 2006 IEEE 4th World Conference on Photovoltaic Energy Conversion (IEEE Cat. No. 06CH37747), IEEE, May 1, 2006, pp. 2227-2230.; in Extended European Search Report.
L.Schirone et al., "Fault detection in a photovoltaic plant by time domain reflectometry" Progress in Photovoltaics: Research and Applications, vol. 2, No. 1, Jan. 1, 1994, pp. 35-44.; in Extended European Search Report.

* cited by examiner (a)

(b)

(a)

(b)

(a)

(b)

US 9,496,823 B2

FAULT DIAGNOSIS SYSTEM, FAULT DIAGNOSIS DEVICE, FAULT DIAGNOSIS METHOD, PROGRAM, COMPUTER-READABLE MEDIUM, AND DEVICE UNDER TEST

TECHNICAL FIELD

The present invention relates to a fault diagnosis system, a fault diagnosis device, a fault diagnosis method, a program, a computer-readable medium, and a device under test, and particularly relates to a fault diagnosis system for diagnosing a photovoltaic array having a photovoltaic string having pluralities of photovoltaic modules connected in series by estimating a fault location of the photovoltaic array or the like.

BACKGROUND ART

Recently, a large number of solar cells are produced because of growing awareness of importance of utilizing natural energy. And some cases are reported where solar cells get out of order or get in trouble such as decrease of output power because of aging degradation. So, some fault diagnosis methods for diagnosing solar cells have been developed.

For example, a fault diagnosis method for diagnosing a photovoltaic string having pluralities of photovoltaic modules connected in series is described in Patent Literature 1. This method requires two configuration of the first configuration where a signal generator and a waveform observer are connected to one end of a normal photovoltaic string with the other end being open end, and the second configuration where a signal generator and a waveform observer are connected to one end of a photovoltaic string under test. A difference signal is obtained by the difference between an observation signal (an output signal reflected out of the photovoltaic string) by the waveform observer in the first configuration and an observation signal by the waveform observer in the second configuration. Given that the time point when rising of the difference signal exceeds a threshold is denoted by $T_a$, that the time point when falling of the difference signal exceeds a threshold is denoted by $T_b$, and that the distance from the signal generator to the open end in the second configuration is denoted by $L_A$, the distance $L_c$ from the signal generator to the fault location is obtained by $L_c=(T_a/T_b)*L_A$.

CITATION LIST

Patent Literature

[Patent Literature 1]: JP 2009-021341 A1.

SUMMARY OF INVENTION

Technical Problem

The method described in Patent Literature 1 requires not only an observation signal from the photovoltaic string under test in the second configuration but also an observation signal from the normal photovoltaic string in the first configuration. That is, the method requires the preparation of a photovoltaic string to be compared.

However, generally, the observation signal from a photovoltaic string installed in the field can be influenced a lot by the installation environment. So, if a photovoltaic string with aging degradation in the field is diagnosed, for example, it is difficult to prepare the corresponding photovoltaic string to be compared. Concretely speaking, the observation signal can be influenced a lot just by the length of a cable from the signal generator to the photovoltaic string. Thus, in a fault diagnosis method which requires an output signal in the first configuration, as described in Patent Literature 1, it is difficult to obtain necessary information for estimating a fault location. Such a fault diagnosis method requires a too hard preparation to execute handily.

Besides, the fault diagnosis for finding fault location in a photovoltaic module has even more problems than the fault diagnosis for checking only whether there is a fault in a photovoltaic string or not or the fault diagnosis for estimating which photovoltaic module among the photovoltaic string has a fault. In the following, "a photovoltaic module" denotes pluralities of photovoltaic cells connected in series and be fixed on a substrate. And "a photovoltaic string" denotes pluralities of photovoltaic modules connected in series.

The first problem characteristic for the fault diagnosis of a photovoltaic module is that high resolution performance of the diagnosis method is required. When diagnosing a single photovoltaic module, signal transmission distance is shorter than that in diagnosing a photovoltaic string having pluralities of photovoltaic modules. Thus, observation signal is obtained during the shorter time. This means that faults in neighboring photovoltaic cells cannot be distinguished without an extremely high-speed pulse generator and an extremely high-speed waveform observer.

It is, therefore, an object of the present invention to provide a fault diagnosis system for correctly finding fault location in a photovoltaic string or a photovoltaic module (denoted by "photovoltaic string etc." in the following) without information of a normal photovoltaic string etc., or the like.

Solution to Problem

A first aspect in accordance with the present invention provides a fault diagnosis system for diagnosing a photovoltaic array having a photovoltaic string having pluralities of photovoltaic modules connected in series by estimating a fault location of the photovoltaic array, comprising a signal generator for generating a positive terminal input signal which is an input signal into the photovoltaic string when the signal generation device is connected not to negative terminal but to positive terminal of the photovoltaic string and for generating a negative terminal input signal which is an input signal into the photovoltaic string when the signal generation device is connected not to positive terminal but to negative terminal of the photovoltaic string; a waveform observer for observing a positive terminal output signal which is outputted from the positive terminal as a reflected wave of the positive terminal input signal and for observing a negative terminal output signal which is outputted from the negative terminal as a reflected wave of the negative terminal input signal; and a diagnosis unit for estimating the fault location based on the positive terminal output signal and the negative terminal output signal observed by the waveform observer, wherein the diagnosis unit includes: a memory unit for storing a string length which is distance between the positive terminal and the negative terminal of the photovoltaic string; a reflected wave analyzing unit for analyzing the positive terminal output signal and the negative terminal output signal observed by the waveform observer, for determining positive terminal reflection time which is amount of time from inputting the positive terminal input signal to observing the positive terminal output signal and negative terminal reflection time which is amount of time from inputting the negative terminal input signal to observing the positive terminal output signal, and for making the memory unit store the positive terminal reflection time and the negative terminal reflection time; and a computing unit for estimating distance from the positive terminal or from the negative terminal to the fault location based on the string length and the positive terminal reflection time and the negative terminal reflection time.

A second aspect in accordance with the present invention provides the fault diagnosis system of the first aspect, further comprising an attenuator for attenuating signal transferred in the photovoltaic string not to cause reflection when connected to the photovoltaic string; a switching unit for switching connection between the positive terminal or the negative terminal and the signal generator or the attenuator; and a switch controlling unit for controlling connection behavior of the switching unit, wherein the reflected wave analyzing unit determines the positive terminal reflection time and the negative terminal reflection time by analyzing a reflected wave of an input signal inputted by the signal generator when the switch controlling unit controls the switching unit to connect one of the positive terminal and the negative terminal to the signal generator and not to connect the attenuator either the positive terminal or the negative terminal, and by analyzing a reflected wave of an input signal inputted by the signal generator when the switch controlling unit controls the switching unit to connect the other of the positive terminal and the negative terminal to the signal generator and not to connect the attenuator either the positive terminal or the negative terminal, wherein, if the positive terminal reflection time and the negative terminal reflection time are determined to be different, the diagnosis unit estimates the distance from the positive terminal or from the negative terminal to the fault location based on the string length and the positive terminal reflection time and the negative terminal reflection time, and wherein, if the positive terminal reflection time and the negative terminal reflection time are determined to be equivalent, the switch controlling unit controls the switching unit to connect a terminal, opposite to a terminal which is connected to the signal generator, to the attenuator, the waveform observer observes a reflected wave of an input signal inputted by the signal generator, the reflected wave analyzing unit determines whether reflection is caused or not, wherein, if the reflection is determined to be caused, the diagnosis unit estimates the distance from the positive terminal or from the negative terminal to the fault location based on the string length and the positive terminal reflection time and the negative terminal reflection time, and wherein, if the reflection is determined not to be caused, the diagnosis unit diagnoses the photovoltaic string as normal.

A third aspect in accordance with the present invention provides the fault diagnosis system of the first aspect, further comprising an attenuator for attenuating signal transferred in the photovoltaic string not to cause reflection when connected to the photovoltaic string; a switching unit for switching connection between the positive terminal or the negative terminal and the signal generator or the attenuator; and a switch controlling unit for controlling connection behavior of the switching unit, wherein the switch controlling unit controls the switching unit to connect one of the positive terminal and the negative terminal to the signal generator and to connect the other terminal to the attenuator, wherein the reflected wave analyzing unit determines whether reflection of an input signal inputted by the signal generator is caused or not, wherein, if the reflection is determined not to be caused, the diagnosis unit diagnoses the photovoltaic string as normal, wherein, if the reflection is determined to be caused, the reflected terminal analyzing unit determines the positive terminal reflection time and the negative terminal reflection time by analyzing a reflected wave of an input signal inputted by the signal generator, and by analyzing a reflected wave of an input signal inputted by the signal generator when the switch controlling unit controls the switching unit to connect the other terminal to the signal generator, and the diagnosis unit estimates the fault location.

A fourth aspect in accordance with the present invention provides a fault diagnosis device for diagnosing a photovoltaic array having a photovoltaic string having pluralities of photovoltaic modules connected in series by estimating a fault location of the photovoltaic array, comprising a memory unit for storing a string length which is distance between a positive terminal and a negative terminal of the photovoltaic string or number of the photovoltaic modules; and a computing unit for estimating the fault location of the photovoltaic string based on the string length or the number of the photovoltaic modules and based on comparison result between two reflected waves observed by a waveform observer of two input signals inputted by a signal generator when the signal generator is connected to the positive terminal and when the signal generator is connected to the negative terminal.

A fifth aspect in accordance with the present invention provides a fault diagnosis method utilizing a fault diagnosis system for diagnosing a photovoltaic array having a photovoltaic string having pluralities of photovoltaic modules connected in series by estimating a fault location of the photovoltaic array, wherein the fault diagnosis system includes a signal generator for generating a positive terminal input signal which is an input signal into the photovoltaic string when the signal generation device is connected not to negative terminal but to positive terminal of the photovoltaic string and for generating a negative terminal input signal which is an input signal into the photovoltaic string when the signal generation device is connected not to positive terminal but to negative terminal of the photovoltaic string; a waveform observer for observing a positive terminal output signal which is outputted from the positive terminal as a reflected wave of the positive terminal input signal and for observing a negative terminal output signal which is outputted from the negative terminal as a reflected wave of the negative terminal input signal; and a diagnosis unit for estimating the fault location based on the positive terminal output signal and the negative terminal output signal observed by the waveform observer, wherein the diagnosis unit includes a memory unit for storing a string length $L_1$ which is distance between the positive terminal and the negative terminal of the photovoltaic string, and wherein the diagnosis method comprises analyzing, by a reflected wave analyzing unit of the diagnosis unit, the positive terminal output signal and the negative terminal output signal observed by the waveform observer, determining positive terminal reflection time $T_1$ which is amount of time from inputting the positive terminal input signal to observing the positive terminal output signal and negative terminal reflection time $T_2$ which is amount of time from inputting the negative terminal input signal to observing the positive terminal output signal, and for making the memory unit store the positive terminal reflection time and the negative terminal reflection time; and computing, by a computing unit of the diagnosis unit, distance L from the positive terminal or from the negative terminal to the fault location based on formula (1) to estimate the fault location of the photovoltaic string.

A sixth aspect in accordance with the present invention provides a fault diagnosis method utilizing a fault diagnosis system for diagnosing a photovoltaic array having a photovoltaic string having pluralities of photovoltaic modules connected in series by estimating a fault location of the photovoltaic array, wherein the fault diagnosis system includes a signal generator for generating a positive terminal input signal which is an input signal into the photovoltaic string when the signal generation device is connected not to negative terminal but to positive terminal of the photovoltaic string and for generating a negative terminal input signal which is an input signal into the photovoltaic string when the signal generation device is connected not to positive terminal but to negative terminal of the photovoltaic string; a waveform observer for observing a positive terminal output signal which is outputted from the positive terminal as a reflected wave of the positive terminal input signal and for observing a negative terminal output signal which is outputted from the negative terminal as a reflected wave of the negative terminal input signal; and a diagnosis unit for estimating the fault location based on the positive terminal output signal and the negative terminal output signal observed by the waveform observer, wherein the diagnosis unit includes a memory unit for storing number $N_1$ of the photovoltaic modules in the photovoltaic string, and wherein the diagnosis method comprises analyzing, by a reflected wave analyzing unit of the diagnosis unit, the positive terminal output signal and the negative terminal output signal observed by the waveform observer, determining positive terminal reflection time $T_1$ which is amount of time from inputting the positive terminal input signal to observing the positive terminal output signal and negative terminal reflection time $T_2$ which is amount of time from inputting the negative terminal input signal to observing the positive terminal output signal, and for making the memory unit store the positive terminal reflection time and the negative terminal reflection time; and computing, by a computing unit of the diagnosis unit, the number $N_x$ of the photovoltaic modules from the positive terminal or from the negative terminal to the fault location based on formula (2) to estimate the fault location of the photovoltaic string.

A seventh aspect in accordance with the present invention provides a fault diagnosis method utilizing a fault diagnosis system for diagnosing photovoltaic modules by estimating a fault location of the photovoltaic modules, wherein the fault diagnosis system includes a signal generator for generating a positive terminal input signal which is an input signal into the photovoltaic modules when the signal generation device is connected not to negative terminal but to positive terminal of the photovoltaic modules and for generating a negative terminal input signal which is an input signal into the photovoltaic modules when the signal generation device is connected not to positive terminal but to negative terminal of the photovoltaic modules; a waveform observer for observing a positive terminal output signal which is outputted from the positive terminal as a reflected wave of the positive terminal input signal and for observing a negative terminal output signal which is outputted from the negative terminal as a reflected wave of the negative terminal input signal; a diagnosis unit for estimating the fault location based on the positive terminal output signal and the negative terminal output signal observed by the waveform observer; a conductive body which causes capacitance with the photovoltaic modules; and an alignment unit for controlling position of the conductive body and/or the photovoltaic modules, wherein the diagnosis method comprises aligning, by the alignment unit, the position of the conductive body and/or the photovoltaic modules, generating and inputting, by the signal generator, the positive terminal input signal into the photovoltaic modules and observing, by the waveform observing unit, the positive terminal output signal, and generating and inputting, by the signal generator, the negative terminal input signal into the photovoltaic modules and observing, by the waveform observing unit, the negative terminal output signal, estimating, by a computing unit of the diagnosis unit, the fault location based on the positive terminal output signal and the negative terminal output signal.

An eighth aspect in accordance with the present invention provides the fault diagnosis method of the seventh aspect, wherein, in the aligning, the alignment unit increases the capacitance between the conductive body and the photovoltaic modules by bringing the conductive body and the photovoltaic modules closer.

A ninth aspect in accordance with the present invention provides the fault diagnosis method of the seventh or the eighth aspect, wherein the conductive body is grounded.

A tenth aspect in accordance with the present invention provides the fault diagnosis method of the eighth or the ninth aspect, wherein the photovoltaic modules further includes pluralities of photovoltaic cells with a variety of capacitances, and wherein, in the aligning, the alignment unit decreases variation of capacitances of the pluralities of photovoltaic cells by bringing each photovoltaic cell and the conductive body uniformly closer and uniformly increasing the capacitances of the photovoltaic cells.

An eleventh aspect in accordance with the present invention provides the fault diagnosis method of the eighth or the ninth aspect, wherein the capacitance occurs uniformly in the photovoltaic modules, and wherein, in the aligning, the alignment unit brings the conductive body and a site of the photovoltaic modules where small capacitance occurs to increase capacitance of the site.

A twelfth aspect in accordance with the present invention provides the fault diagnosis method of the tenth or the eleventh aspect, wherein the conductive body has conductive substance in a periodic arrangement, or the conductive body has conductive substance in an arrangement with the same translation symmetry with that of arrangement of pluralities of photovoltaic cells, and wherein, in the aligning, the alignment unit increases capacitance between the conductive body and the photovoltaic modules by bringing the conductive body and the photovoltaic modules closer so that such amount of conductive substance is included in each of cell spaces that cause uniform capacitance between the conductive body and each of the photovoltaic cells, the cell spaces being formed when acceptance surfaces of the photovoltaic cells are translated perpendicular to the acceptance surfaces.

A thirteenth aspect in accordance with the present invention provides the fault diagnosis method of the twelfth aspect, wherein the pluralities of photovoltaic cells are aligned in the same plane, wherein the conductive body is a metal plate, and wherein, in the aligning, the alignment unit brings the metal plate and the photovoltaic modules closer with the metal plate and the pluralities of photovoltaic cells parallel to increase capacitance between the conductive body and the photovoltaic modules.

A fourteenth aspect in accordance with the present invention provides the fault diagnosis method of the seventh through the thirteenth aspect, A seventeenth aspect in accordance with the present invention provides a wherein the fault diagnosis system further includes an attenuator for attenuating signal transferred in the photovoltaic modules not to cause reflection when connected to the photovoltaic modules; a switching unit for switching connection between the positive terminal or the negative terminal and the signal generator or the attenuator; and a switch controlling unit for controlling connection behavior of the switching unit, wherein the fault diagnosis method further comprises first controlling, by the switch controlling unit, before the generating and inputting, the switching unit to connect one of the positive terminal and the negative terminal to the signal generator and not to connect the attenuator either the positive terminal or the negative terminal; and determining, by the reflected wave analyzing unit, after the observing and before the computing, positive terminal reflection time, which is amount of time from inputting the positive terminal input signal to observing the positive terminal output signal, and negative terminal reflection time, which is amount of time from inputting the negative terminal input signal to observing the positive terminal output signal, by analyzing a reflected wave of an input signal inputted by the signal generator, and by analyzing a reflected wave of an input signal inputted by the signal generator when the switch controlling unit controls the switching unit to connect the other terminal to the signal generator and not to connect the attenuator either the positive terminal or the negative terminal, wherein, if the positive terminal reflection time and the negative terminal reflection time are determined to be different in the determining, the diagnosis unit estimates the distance from the positive terminal or from the negative terminal to the fault location based on the positive terminal reflection time and the negative terminal reflection time, and wherein, if the positive terminal reflection time and the negative terminal reflection time are determined to be equivalent in the determining, the fault diagnosis method further comprises after the determining and before the computing: second controlling, by the switch controlling unit, the switching unit to connect a terminal, opposite to a terminal which is connected to the signal generator, to the attenuator; and judging, by the reflected wave analyzing unit, whether reflection is caused or not, based on observation by the waveform observer, of a reflected wave of an input signal inputted by the signal generator, wherein, if the reflection is judged to be caused in the judging, the diagnosis unit, in the estimating, estimates the distance from the positive terminal or from the negative terminal to the fault location based on the positive terminal reflection time and the negative terminal reflection time, and wherein, if the reflection is determined not to be caused in the judging, the diagnosis unit, in the estimating, diagnoses the photovoltaic string as normal.

An eighteenth aspect in accordance with the present invention provides a fault diagnosis device for diagnosing a photovoltaic module by estimating a fault location of the photovoltaic module, comprising an alignment unit for changing capacitance between a conductive body and the photovoltaic module by controlling relative position between the conductive body and the photovoltaic module, and a computing unit for estimating the fault location in the photovoltaic module whose capacitance with the conductive body is controlled, based on a positive terminal output signal which is a reflected wave of a positive terminal input signal which is an input signal into the photovoltaic module when the fault diagnosis device is connected not to negative terminal but to positive terminal of the photovoltaic module, and based on a negative terminal output signal which is a reflected wave of a negative terminal input signal which is an input signal into the photovoltaic module when the fault diagnosis device is connected not to positive terminal but to negative terminal of the photovoltaic module.

A nineteenth aspect in accordance with the present invention provides an alignment device utilized with a fault diagnosis device for diagnosing a photovoltaic module by estimating a fault location of the photovoltaic module, comprising a conductive body and an alignment unit for changing capacitance between the conductive body and the photovoltaic module by controlling relative position between the conductive body and the photovoltaic module, wherein the fault diagnosis device includes a computing unit for estimating the fault location of the photovoltaic module whose capacitance with the conductive body is controlled, based on a positive terminal output signal which is a reflected wave of a positive terminal input signal which is an input signal into the photovoltaic module when the fault diagnosis device is connected not to negative terminal but to positive terminal of the photovoltaic module, and based on a negative terminal output signal which is a reflected wave of a negative terminal input signal which is an input signal into the photovoltaic module when the fault diagnosis device is connected not to positive terminal but to negative terminal of the photovoltaic module.

A twentieth aspect in accordance with the present invention provides a program capable of causing a computer to diagnose a photovoltaic module by estimating a fault location of the photovoltaic module by functioning as an alignment unit for changing capacitance between the conductive body and the photovoltaic module by controlling relative position between the conductive body and the photovoltaic module, and a computing unit for estimating the fault location of the photovoltaic module whose capacitance with the conductive body is controlled, based on a positive terminal output signal which is a reflected wave of a positive terminal input signal which is an input signal into the photovoltaic module when the fault diagnosis device is connected not to negative terminal but to positive terminal of the photovoltaic module, and based on a negative terminal output signal which is a reflected wave of a negative terminal input signal which is an input signal into the photovoltaic module when the fault diagnosis device is connected not to positive terminal but to negative terminal of the photovoltaic module.

A twenty first aspect in accordance with the present invention provides a non-transitory computer-readable medium storing the program of the twentieth aspect.

A twenty second aspect in accordance with the present invention provides the fault diagnosis method of any of the seventh through fourteenth aspect, wherein the fault diagnosis system includes an attenuator for attenuating signal transferred in the photovoltaic modules not to cause reflection when connected to the photovoltaic modules, a switching unit for switching connection between the positive terminal or the negative terminal and the signal generator or the attenuator, and a switch controlling unit for controlling connection behavior of the switching unit, wherein the fault diagnosis method further comprises first controlling, by the switch controlling unit, before the generating and inputting, the switching unit to connect one of the positive terminal and the negative terminal to the signal generator and to connect the attenuator the other terminal, and judging, by the reflected wave analyzing unit of the diagnosis unit, after the observing and before the estimating, whether there is a reflected wave of an input signal inputted by the signal generator or not, wherein, if the reflection is determined not to be caused in the judging, the diagnosis unit, in the estimating, diagnoses the photovoltaic string as normal, and wherein, if the reflection is judged to be caused in the judging, the diagnosis unit, in the estimating, determines the positive terminal reflection time and the negative terminal reflection time by analyzing a reflected wave of an input signal inputted by the signal generator and by analyzing a reflected wave of an input signal inputted by the signal generator when the switch controlling unit controls the switching unit to connect the other terminal to the signal generator, and the diagnosis unit estimates the fault location.

A twenty third aspect in accordance with the present invention provides the fault diagnosis method of any of the seventh through fourteenth aspect and the twenty second aspect, wherein, in the estimating, by a computing unit of the diagnosis unit, estimates the fault location of the photovoltaic module by computing the distance $L_x$ based on formula (1) from the positive terminal or the negative terminal to the fault location.

A twenty fourth aspect in accordance with the present invention provides the fault diagnosis method of any of the seventh through fourteenth aspect and the twenty second aspect, wherein, in the estimating, by a computing unit of the diagnosis unit, estimates the fault location of the photovoltaic module by computing the number $N_x$ of photovoltaic cells based on formula (2) from the positive terminal or the negative terminal to the fault location.

The formula (1) and (2) described above is shown in the following.

$$L_x = L_1 \times \frac{T_1}{T_1 + T_2} \quad (1)$$

Here, in the formula (1), $L_1$ denotes the transmission distance which is the distance from the positive terminal to the negative terminal of the photovoltaic module. $T_1$ denotes the positive terminal reflection time which is amount of time from inputting the positive terminal input signal to observing the positive terminal output signal. $T_2$ denotes the negative terminal reflection time which is amount of time from inputting the negative terminal input signal to observing the positive terminal output signal.

$$N_x = N_1 \times \frac{T_1}{T_1 + T_2} \quad (2)$$

Here, in the formula (2), $N_1$ denotes the number of the photovoltaic cells. $T_1$ denotes the positive terminal reflection time which is amount of time from inputting the positive terminal input signal to observing the positive terminal output signal. $T_2$ denotes the negative terminal reflection time which is amount of time from inputting the negative terminal input signal to observing the positive terminal output signal.

Here, the fault diagnosis system may include two signal generators, each for the positive terminal and the negative terminal. As well, the fault diagnosis system may include two waveform observers, each for the positive terminal and the negative terminal.

In addition, the signal generator may input different input signals for the positive terminal and the negative terminal of the photovoltaic module for the purpose of making it easy to identify into which terminal the input signal that caused the observed signal is inputted. For example, the signal generator may input a convex pulse to one terminal and a calathiform pulse to the other terminal.

Further, a user may switch the connection manually between the positive terminal or the negative terminal of the photovoltaic module and the signal generator or the attenuator in place of switching utilizing the switching unit and the switch controlling unit.

Advantageous Effects of Invention

According to the present invention, it is made possible to diagnose a photovoltaic string by inputting input signals into the positive terminal and the negative terminal. That is, it is made possible to diagnose a photovoltaic string etc. under test without a normal photovoltaic string etc.

Besides, in general, a photovoltaic string etc. is installed so that the positive terminal and the negative terminal are closely positioned. Thus, it is very easy to switch the connection of a signal generator and a waveform observer with the positive terminal to with the negative terminal of the photovoltaic string etc. Therefore, according to each aspect of the present invention, much more significant cost reduction is possible than preparing the information of output signal from a corresponding normal photovoltaic string.

Further, according to each aspect of the present invention, the information of reflected waves outputted from the positive terminal and the negative terminal differs only if the fault locates just in the middle of the photovoltaic string etc. Thus, it is easy to diagnose the photovoltaic string etc. which has a fault near the positive terminal or the negative terminal which is an open end. This is worthy of special mention because it is hard to distinguish the output signal from a normal photovoltaic string etc. and the output signal from the photovoltaic string etc. which has a fault near the positive terminal or the negative terminal which is an open end. Here, the device under test in accordance with the seventeenth aspect of the present invention and the fault diagnosis method in accordance with the seventh aspect of the present invention relate to each other in a complementary way in their special technical features.

Besides, according to the second aspect of the present invention, it is made easier to diagnose a photovoltaic string etc. even if there is only a small difference between the positive terminal reflection time and the negative terminal reflection time. This is because the attenuator also enables the judgment whether the photovoltaic string etc. has a fault based on whether reflected wave is observed or not. Thus, it is made easier to diagnose a photovoltaic string even if the fault locates in the middle of the photovoltaic string etc.

Further, according to the third aspect of the present invention, if a reflected wave is not observed when an input signal is inputted into only one terminal of the positive terminal and the negative terminal of the photovoltaic string etc., then it is possible to diagnose the photovoltaic string etc. under test to be normal. Thus, if the photovoltaic string etc. under test is normal, the switch controlling unit does not have to control the switching unit to change the connection between the photovoltaic string etc. and the signal generator to diagnose the photovoltaic string etc. That is, it is possible not to input an input signal into the other terminal, which makes the fault diagnosis of the photovoltaic string etc. even easier.

Further, according to the fifth or the sixth aspect of the present invention, it is possible to identify the fault location based on the computing result using formula, which makes the fault diagnosis of the photovoltaic string etc. even easier.

Next, further advantage according to the seventh aspect of the present invention is described. Generally, the propagation time t for a signal to propagate a unit length in a circuit with inductance L and capacitance C per unit length is expressed by the following formula (3). Thus, given that the inductance L is constant, the propagation time t of a signal is proportional to the square root of the capacitance C.

$$t=\sqrt{L \times C} \quad (3)$$

Thus, according to the seventh aspect of the present invention, the alignment unit controls the positions of the conductive body and/or the photovoltaic module to control the capacitance between the conductive body and the photovoltaic module, which enables to control the propagation time t of a signal.

Especially, according to the eighth aspect of the present invention, the photovoltaic module is diagnosed while the conductive body and the photovoltaic module are positioned close. Thus, the capacitance C in the formula (3) increases, which leads to increased time t necessary for a signal to propagate. Thus, it is possible to control the propagation speed of a signal to slow down. As a result, the fault diagnosis with high resolution is possible without a high-speed pulse generator and a high-speed waveform observer. That is, the first problem characteristic for the fault diagnosis of a photovoltaic module is solved. As a result, it is possible to provide a fault diagnosis method for identifying the fault location of a photovoltaic module accurately or the like.

Further, according to the ninth aspect of the present invention, the conductive body is grounded, which makes easier to increase the capacitance between the conductive body and the photovoltaic module.

Here, the second problem characteristic for the fault diagnosis of a photovoltaic module is that the propagation speed of a signal is not uniform. Most of photovoltaic modules are equipped with a metal frame, for example, surrounding the photovoltaic module in order to improve impact strength. Then, in a photovoltaic module having pluralities of photovoltaic cells connected in series, the capacitance on the periphery is larger than that in the middle. As a result, the propagation time t increases only on the periphery and the propagation speed of a signal is slowed down. Then, there is difference in propagation speed between the periphery area and the middle area, which degrades the accuracy of identifying the fault location.

Then, according to the tenth aspect of the present invention, each photovoltaic cell and the conductive body are brought closer uniformly, which enables to increase the capacity of the whole photovoltaic module uniformly. As a result, it is possible to homogenize the capacitance C caused in the photovoltaic module and the signal propagation speed. That is, the second problem characteristic for the fault diagnosis of a photovoltaic module is solved. As a result, it is possible to provide a fault diagnosis method for identifying the fault location of a photovoltaic module accurately or the like.

In addition, according to the eleventh aspect of the present invention, it is possible to increase the capacitance in an area with small capacitance in a focused manner for the photovoltaic module whose capacitance differs according to its site. Such a method also enables to homogenize the capacitance C caused in the photovoltaic module and the signal propagation speed. That is, the second problem characteristic for the fault diagnosis of a photovoltaic module is solved. And, it is possible to provide a fault diagnosis method for identifying the fault location of a photovoltaic module accurately or the like.

Further, according to the twelfth or the thirteenth aspect of the present invention, the conductive body itself has conductive substance in such an arrangement that the conductive body increases the capacitance formed with the photovoltaic cells uniformly. Thus, it is easier to increase the capacitance uniformly. That is, the second problem characteristic for the fault diagnosis of a photovoltaic module is solved. And, it is possible to provide a fault diagnosis method for identifying the fault location of a photovoltaic module accurately or the like.

Further, according to the fourteenth aspect of the present invention, it is easier to diagnose the photovoltaic module even if there is only small difference between the positive terminal reflection time and the negative terminal reflection time. This is because the attenuator also enables the judgment whether the photovoltaic string etc. has a fault based on whether reflected wave is observed or not. Thus, it is made easier to diagnose a photovoltaic string even if the fault locates in the middle of the photovoltaic string etc.

Further, according to the twenty second aspect of the present invention, if a reflected wave is not observed when an input signal is inputted into only one terminal of the positive terminal and the negative terminal of the photovoltaic string etc., then it is possible to diagnose the photovoltaic string etc. under test to be normal. Thus, if the photovoltaic string etc. under test is normal, the switch controlling unit does not have to control the switching unit to change the connection between the photovoltaic string etc. and the signal generator to diagnose the photovoltaic string etc. That is, it is possible not to input an input signal into the other terminal, which makes the fault diagnosis of the photovoltaic string etc. even easier.

Further, according to the twenty third and the twenty fourth aspect of the present invention, it is possible to identify the fault location based on the computing result using formula, which makes the fault diagnosis of the photovoltaic string etc. even easier.

BRIEF DESCRIPTION OF DRAWINGS

FIG. 12(a) shows the connection order of the photovoltaic cells connected in series. FIG. 12(b) shows the site assumed as a fault location.

DESCRIPTION OF EMBODIMENTS

The embodiment in accordance with the present invention is described in detail in the following.

Example 1

First of all, the fault diagnosis system in accordance with the present invention is described. The fault diagnosis system described here is developed by the present inventors and has not been publicly known on or before the priority date of the present application (See Appl. No. JP 2009-281148). Thus, the fault diagnosis system described here is not eligible as cited invention which denies the novelty or the inventive step of the present invention.

Figure 1:
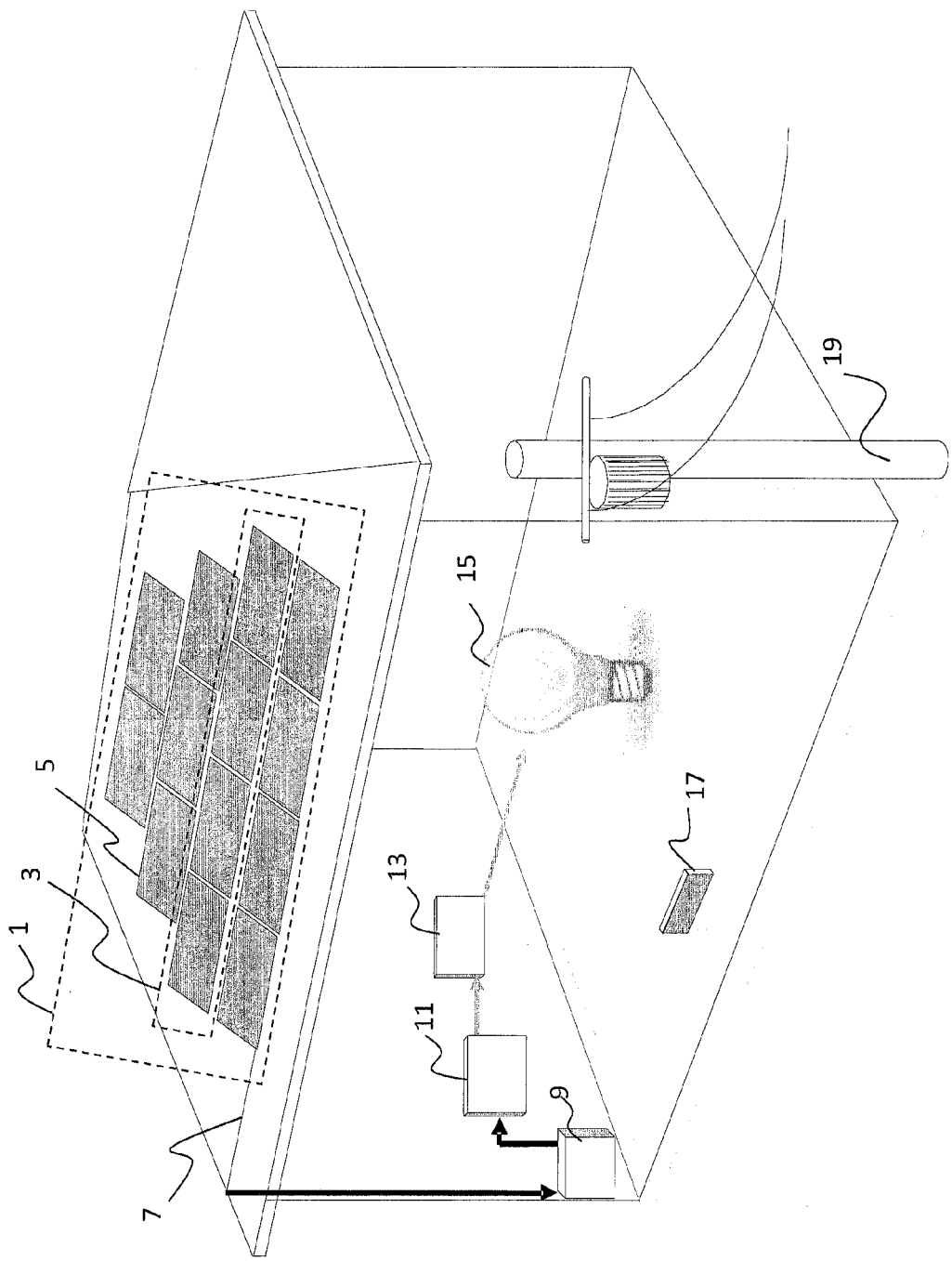
FIG. 1 shows a general configuration of installed photovoltaic system.
Figure 2:
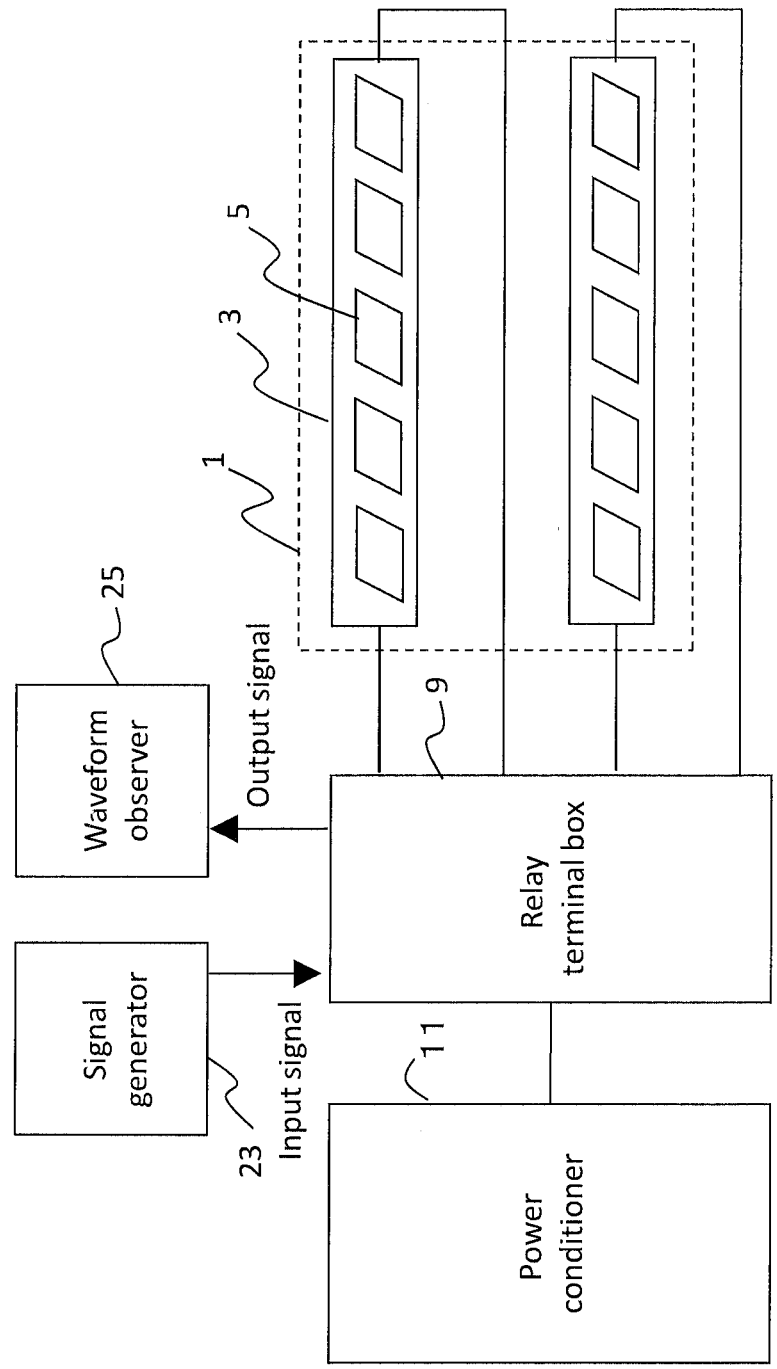
FIG. 2 shows a schematic block diagram of a photovoltaic array.

First, the photovoltaic system under test is described. FIG. 1 shows a general configuration of installed photovoltaic system. FIG. 2 shows a schematic block diagram of a photovoltaic array.

As shown in FIG. 1, a photovoltaic array 1 for a building is installed outside generally on roof, for example, or the like. Usually, the photovoltaic array 1 includes pluralities of photovoltaic strings 3 connected in parallel. Each of the photovoltaic strings 3 has pluralities of photovoltaic modules 5 connected in series. The electricity produced at the photovoltaic array 1 flows within a cable 7 as direct current which flows, via a relay terminal box 9 (an example of "switching unit" in Claims), to a power conditioner 11. The power conditioner 11 displays the output level of the photovoltaic array 1 and converts the direct current, outputted from the photovoltaic array, into alternate current. The alternate current maybe consumed, via a distribution board 13, at electric load within home 15. Or the alternate current may be sold, via a electricity meter for electricity trade, to the commercial electric power system 19. These devices are connected to each other via cables.

Here, as shown in FIG. 2, the photovoltaic array 1 is usually configured to have pluralities of 3 photovoltaic strings 3 connected in parallel in the relay terminal box 9, the photovoltaic string having pluralities of photovoltaic modules connected in series, in order to increase stably the output value of the photovoltaic system.

The output level of each of photovoltaic strings can be obtained by switching the connection in the relay terminal box 9 so that only one photovoltaic string is connected to display in the power conditioner 11, for example. When an input signal is inputted into the photovoltaic string 3 under test, the connection is switched in the relay terminal box 9 so that only the photovoltaic string 3 under test is connected and an input signal is inputted by a signal generator 23 described in the following. The reflected output signal from the photovoltaic string 3 under test is observed by a waveform observer 25 described in the following. As shown in FIG. 1, the relay terminal box 9 is generally installed near the ground. Thus, a series of process for the fault diagnosis, such as switching the photovoltaic string 3 under test, inputting and observing signals and so on, is executed near the ground. Therefore, the fault diagnosis method in accordance with the present invention is much easier to execute in that, in spite of diagnosing in the field, the fault diagnosis method in accordance with the present invention does not involve either great care or danger, compared with a conventional fault diagnosis method executed at the very installation site of poor footing such as on a roof. This advantage is emphasized when a photovoltaic module 5 should be found among a matrix of photovoltaic modules 5 electrically connected. Particularly, it is important advantage for diagnosing such a large photovoltaic system as a mega solar system.

Figure 3:
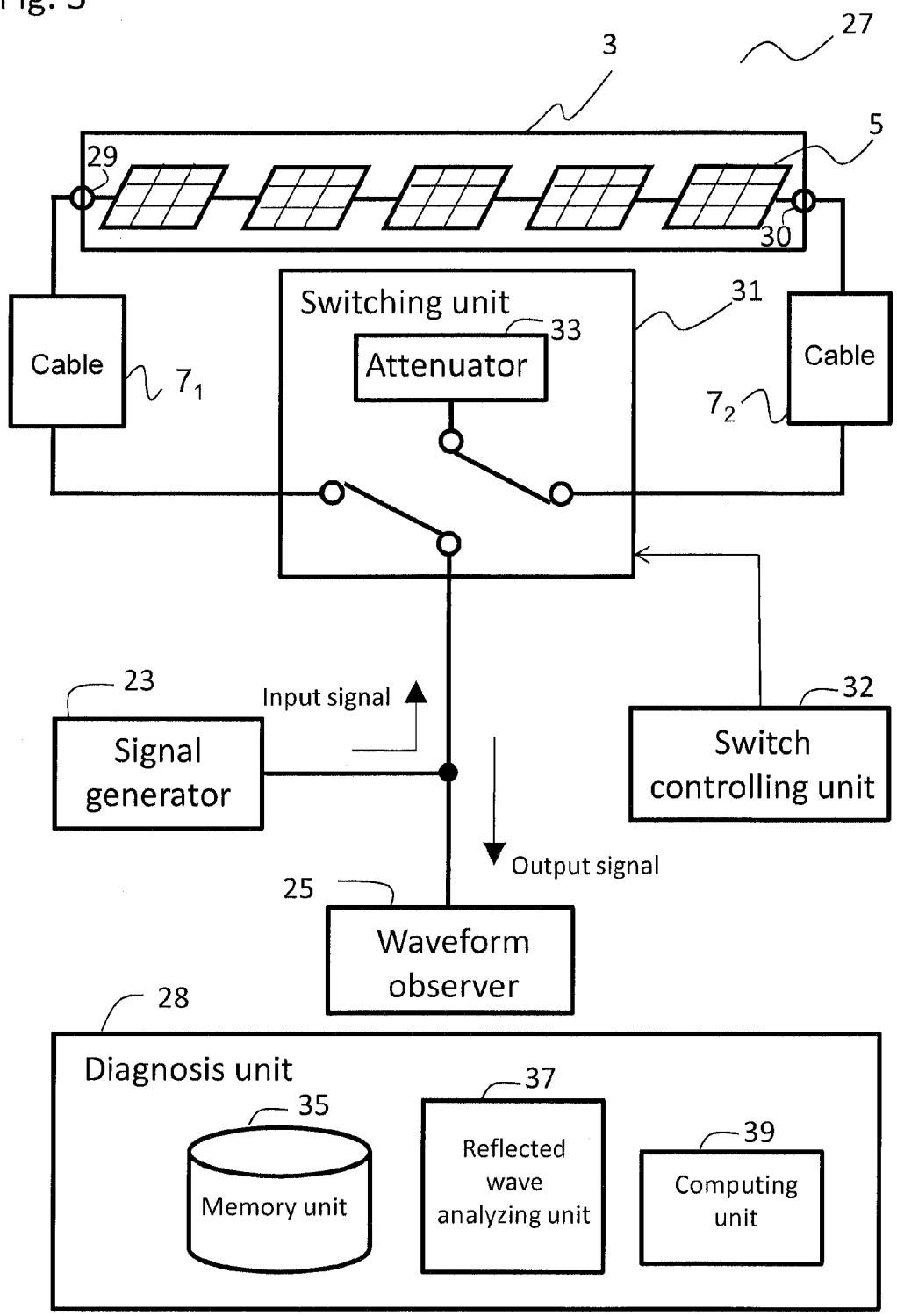
FIG. 3 shows a schematic block diagram illustrating an example of the fault diagnosis system in accordance with the present invention.

In the following, referring to FIG. 3, the fault diagnosis system (an example of "fault diagnosis system" in Claims) in accordance with the present invention is described. FIG. 3 shows a schematic block diagram illustrating an example of the fault diagnosis system 27 in accordance with the present invention.

The fault diagnosis system 27 includes a signal generator (an example of "signal generator" in Claims), a waveform observer 25 (an example of "waveform observer" in Claims), a diagnosis unit 28 (an example of "diagnosis unit" in Claims), a switching unit 31 (an example of "switching unit" in Claims), and a switch controlling unit 32 (an example of "switch controlling unit" in Claims). The signal generator 23 generates an input signal and input the input signal into the photovoltaic string 3 under test. The waveform observer 25 observes the output signal reflected out of the photovoltaic string 3 when an input signal is inputted into the photovoltaic string 3. The diagnosis unit 28 diagnoses the photovoltaic string 3 by estimating the fault location of the photovoltaic string 3 based on the output signal observed by the waveform observer 25. The switching unit 31 switches the connection between the signal generator 23 and terminals of the photovoltaic string 3, a positive terminal 29 or a negative terminal 30. And the switching unit 31 also switches the connection between the waveform observer 25 and the positive terminal 29 or the negative terminal 30. The positive terminal 29 and the negative terminal 30 are connected to the switching unit 31 via a cable $7_1$ or a cable $7_2$, respectively. The switch controlling unit 32 controls the connection behavior of the switching unit 31.

The switching unit 31 includes an attenuator 33 (an example of "attenuator" in Claims). The attenuator 33 can be connected to a terminal opposite to one of the positive terminal 29 and the negative terminal 30 which is connected to the signal generator 23 and the waveform observer 25. Here, the attenuator 33 is not connected to the same terminal with the signal generator 23 and the waveform observer 25 so as not for the attenuator 33 to attenuate the input signal before inputting or the output signal before observation. The switch controlling unit 32 controls the switching unit 31 to connect between the attenuator 32 and the photovoltaic string 3.

The terminal opposite to a terminal which is connected to the signal generator 23 and the waveform 25 is connected to the attenuator 33, or is an open end not connected to the attenuator 32. When an input signal reaches an open end, a reflected wave occurs. Also, when an input signal reaches a fault location of the photovoltaic string 3 under test, a reflected wave occurs. On the contrary, an input signal which reaches the attenuator 32 is attenuated and a reflected wave does not occur.

Here, terms used in the following are defined. A "positive terminal input signal" denotes an input signal when the signal generator 23 is connected to the positive terminal 29. A "negative terminal input signal" denotes an input signal when the signal generator 23 is connected to the negative terminal 30. And a "positive terminal output signal" denotes a reflected wave of the positive terminal input signal, outputted from the positive terminal 29. A "negative terminal output signal" denotes a reflected wave of the negative terminal input signal, outputted from the negative terminal 30. In addition, "positive terminal reflection time" denotes amount of time from inputting the positive terminal input signal to observing the positive terminal output signal. And "negative terminal reflection time" denotes amount of time from inputting the negative terminal input signal to observing the negative terminal output signal. In addition, "string length" denotes the distance from the positive terminal 29 to the negative terminal 30 of the photovoltaic 3.

The diagnosis unit 28 includes a memory unit 35 (an example of "memory unit" in Claims), a reflected wave analyzing unit 37 (an example of "reflected wave analyzing unit" in Claims), and a computing unit 39 (an example of "computing unit" in Claims). The memory unit 35 stores the string length $L_1$ (an example of "string length" in Claims) which is the distance from the positive terminal 29 to the negative terminal 30 of the photovoltaic string 3. The reflected wave analyzing unit 37 analyzes the positive terminal output signal and the negative terminal output signal observed by the waveform observer 25. Additionally, the reflected wave analyzing unit 37 determines both the positive terminal reflection time and the negative terminal reflection time and make the memory unit 35 store them. The computing unit 39 estimates the fault location by computing the distance from the positive terminal 29 or the negative terminal 30 to the fault location. At that time, the computing unit 39 computes based on not only the string length but also on the positive terminal reflection time and the negative terminal reflection time.

Here, it appears that, when the positive terminal reflection time and the negative terminal reflection time are analyzed, the string length should include the length of the cable 7 from the signal generator 23 to the positive terminal 29 or the negative terminal 30 for accuracy. However, actually, an input signal propagate in a very high speed in the cable 7 from the signal generator 23 to the positive terminal 29 or the negative terminal 30. On the contrary, an input signal propagates slowly in the photovoltaic string 3. Therefore, the time necessary for a signal to propagate from the signal generator 23 to the positive terminal 29 or the negative terminal 30 is negligibly short when compared with the whole reflection time of a reflected wave.

Below, the time for an input signal or a reflected signal to propagate in the cable 7 from the signal generator 23 to the positive terminal 29 or the negative terminal 30 is neglected. This makes it easier to estimate the fault location.

Figure 4:
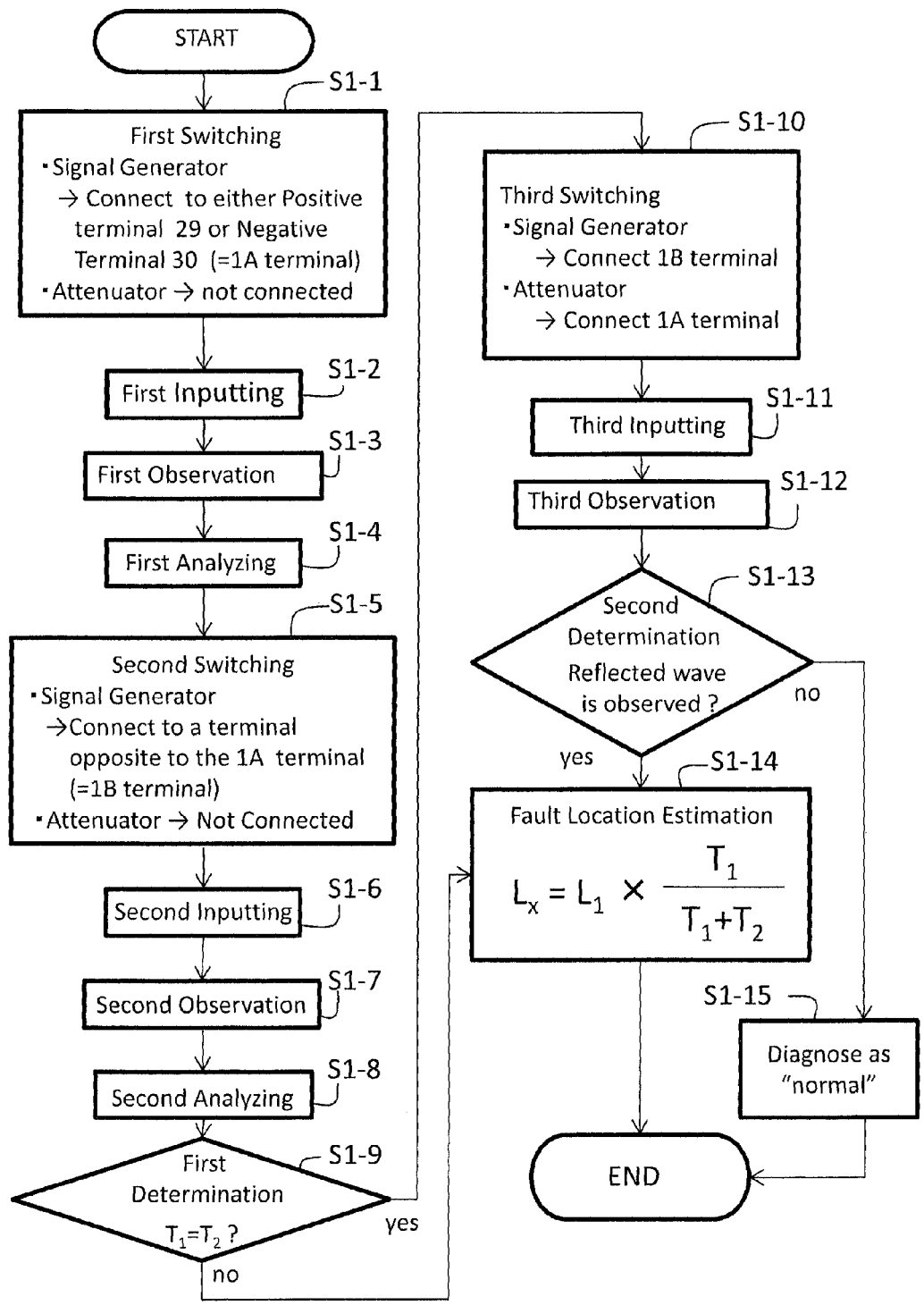
FIG. 4 shows a schematic flowchart as an example of the fault diagnosis process utilizing the fault diagnosis system in FIG. 3.

In the following, referring to FIG. 4, an example of a publicly unknown fault diagnosis method developed by the present inventors is described. FIG. 4 shows a schematic flowchart as an example of the fault diagnosis process utilizing the fault diagnosis system in FIG. 3. Unlike another example of flowchart described below, the attenuator 33 is not connected at first in this process.

<The First Switching to the First Analyzing>

In the first switching step S1-1, the switch controlling unit 32 controls the switching unit 31 to connect the signal generator 23 and the waveform observer 25 to either the positive terminal 29 or the negative terminal 30. Here, the terminal of the photovoltaic string connected to the signal generator 23 and the waveform observer is denoted by "1A terminal." in the step 51-1, the attenuator 33 is not connected to either of the terminals of the photovoltaic string 3.

Next, in the first inputting step S1-2, the signal generator 23 generates and inputs an input signal into the photovoltaic string 3. If the photovoltaic string 3 under test is normal, the input signal is reflected at a terminal opposite to the 1A terminal of the photovoltaic string 3 (denoted by "1B terminal" in the following). If there is a fault somewhere in the photovoltaic string 3, the input signal is reflected at the fault location.

In the first observation step S1-3, the waveform observer 25 observes an output signal reflected at a fault location or the 1B terminal and outputted out of the 1A terminal. In the first analyzing step S1-4, the reflected wave analyzing unit 37 analyzes the observed output signal, determines 1A terminal reflection time $T_1$ which is an amount of time from inputting an input signal to observing an output signal, and making the memory unit 35 store $T_1$.

<The Second Switching to the Second Analyzing>

Next, in the second switching step S1-5, the switch controlling unit 32 controls the switching unit 31 to connect the signal generator 23 and the waveform observer 25 to the 1B terminal. In the step S1-5, too, the attenuator 33 is not connected to either terminal of the photovoltaic string 3. Then, in the second inputting step S1-6, the signal generator 23 generates and inputs an input signal into the photovoltaic string 3. IN the second observation step S1-7, the waveform observer 25 observes the output signal reflected at a fault location or the 1A terminal and outputted out of the 1B terminal. In the second analyzing step S1-8, the reflected wave analyzing unit 37 analyzes the observed output signal, determines 1B terminal reflection time $T_2$ which is an amount of time from inputting an input signal to observing an output signal, and making the memory unit 35 store $T_2$.

<The First Determination to Fault Diagnosis>

In the first determination step S1-9, the computing unit 39 determines whether T1 and T2 are equivalent or not. If T1 and T2 are different, the computing unit determines that there is a fault location. In the fault location estimation step S1-14, the computing unit 39 computes the distance $L_x$ from the 1A terminal to the fault location based on the formula: $L_x L_1 * T_1/(T_1+T_2)$, corresponding to the formula (1), and estimates the fault location. Then, the flow ends.

If $T_1$ and $T_2$ are equivalent, two cases can be thought of. The first case is that a fault positions just in the middle of the photovoltaic string 3 under test. The second case is that there is no fault in the photovoltaic string 3. To distinguish these two cases, the following process is executed. In the third switching step S1-10, the switch controlling unit 32 controls the switching unit 31 to keep connecting the signal generator 23 and the waveform observer 25 to the 1B terminal and to connect the attenuator 33 to the 1A terminal. Then, in the third inputting step S1-11, the signal generator 23 generates and inputs an input signal into the photovoltaic string 3. In the third observation step S1-12, the waveform observer 25 observes the output signal outputted out of the 1B terminal. Here, because the attenuator 33 is connected to the 1A terminal, the input signal may be attenuated and an output signal cannot be observed. In the second determination step S1-13, the reflected wave analyzing unit 37 determines whether a reflected wave is observed or not in the step S1-19. If a reflected wave is observed, that is, in case of the existence of a fault in the photovoltaic string 3, in the fault location estimation step S1-14, the computing unit 39 computes $L_x$ and estimates the fault location. Then, the flow ends.

If, in the second determination step S1-13, a reflected wave is not observed, it is estimated that there is no fault location in the photovoltaic string 3 under test. And, in the step S1-15, the diagnosis unit 28 diagnoses the photovoltaic string 3 as normal. Then, the flow ends.

Here, the reflected wave analyzing unit 37 may determine $T_1$ and $T_2$ at once after observation in the step S1-8, in place of determining $T_1$ and $T_2$ in the step S1-4 and step S1-8, respectively.

Additionally, in the step S1-9, the reflected wave analyzing unit 37 may determine whether $T_1$ and $T_2$ are equivalent.

Further, in the step S1-10, as long as the attenuator is connected to a terminal opposite to the terminal connected to the signal generator 23, the switch controlling unit 32 may control the switching unit 31 to connect the signal generator to the 1A terminal and to connect the attenuator 33 to the 1B terminal.

Further, in the step S1-4 or S1-8, if the reflection time is extremely short, it can be diagnosed that one of the cable $7_1$ and the cable $7_2$, closer to the signal generator 23 may has a fault. Thus, the diagnosis unit 28 may diagnose that the cable $7_1$ or the cable $7_2$ has a fault, or that there may be faults at one of the positive terminal and the negative terminal, closer to the signal generator 23 and at the cable $7_1$ or the cable $7_2$.

Figure 5:
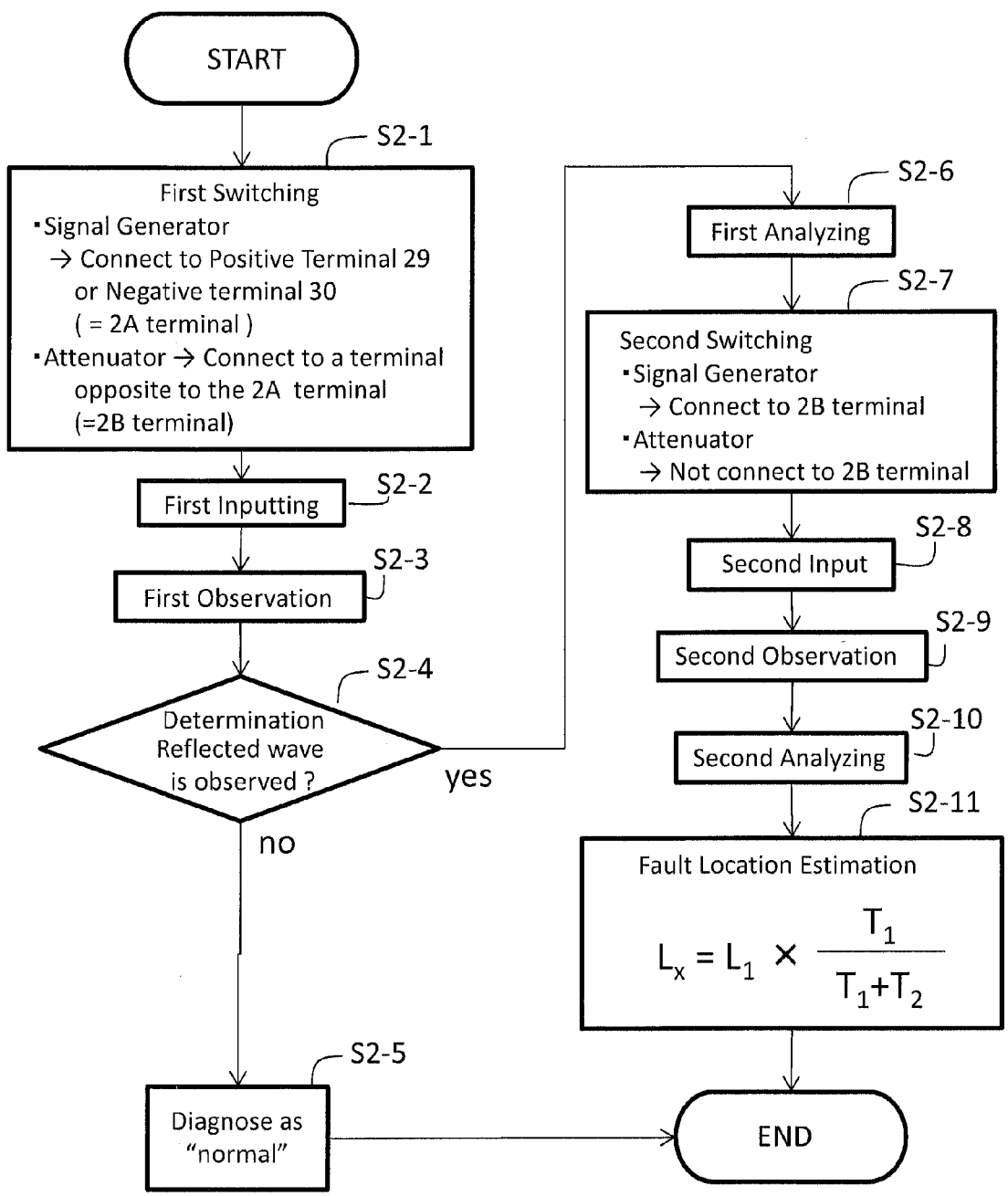
FIG. 5 shows a schematic flowchart as another example of the fault diagnosis process utilizing the fault diagnosis system in FIG. 3.

Next, referring to FIG. 5, another example of fault diagnosis method is described. FIG. 5 shows a schematic flowchart as another example of the fault diagnosis process utilizing the fault diagnosis system in FIG. 3. In this method, the attenuator 33 is connected from the starting of the flow. In the following, the differences between this method and the method in FIG. 4 are mainly described.

<The First Switching to the First Observation>

In the first switching step S2-1, the switch controlling unit 32 controls the switching unit 31 to connect the signal generator 23 and the waveform observer 25 to one of the positive terminal 29 or the negative terminal 30 of the photovoltaic string 3. Here, the terminal of the photovoltaic string connected to the signal generator 23 is denoted by "2A terminal." And the switch controlling unit 32 controls the switching unit 31 to connect the attenuator 33 to the opposite terminal (denoted by "2B terminal" in the following) to the 2A terminal of the photovoltaic string 3. Next, in the first inputting step S2-2, the signal generator 23 generates and inputs an input signal into the photovoltaic string 3. In the first observation step S2-3, the waveform observer 25 observes the output signal outputted out of the 2A terminal. If there is a reflected wave from a fault location of the photovoltaic string 3, the waveform observer 25 observes at least the reflected wave.

<The First Determination to the Fault Diagnosis>

In the first determination step S2-4, the reflected wave analyzing unit 37 determines whether a reflected wave is observed or not. If a reflected wave is not observed, in the step S2-5, the diagnosis unit 28 diagnoses the photovoltaic string 3 as normal, and the flow ends. If a reflected wave is observed, in the first analyzing step S2-6, the reflected wave analyzing unit 37 determines 2A terminal reflection time $T_1$ which is an amount of time from inputting an input signal to the observation of an output signal, and makes the memory unit store $T_1$. Next, in the second switching step S2-7, the switch controlling unit 32 controls the switching unit 31 to disconnect the attenuator 33 from the 2B terminal and to connect the signal generator 23 and the waveform observer 25 to the 2B terminal of the photovoltaic string 3.

Here, the process for observing a reflected wave from a fault location is described. The attenuator 33 maybe connected to the 2A terminal or not. In the second inputting step S2-8, the signal generator 23 generates and inputs an input signal into the 2B terminal. In the second observation step S2-9, the waveform observer 25 observes the output signal outputted out of the 2B terminal of the photovoltaic string 3. In the second analyzing step S2-10, the reflected wave analyzing unit 37 analyzes the observed output signal, determines 2B terminal reflection time $T_2$ which is an amount of time T2 which is an amount of time from inputting an input signal to the observation of an output signal, and makes the memory unit store $T_2$. In the fault location estimation step S2-11, the computing unit 39 computes the distance Lx from the signal generator 23 to the fault location based on the following formula: Lx=L1*T1/(T1+T2), corresponding to the formula (1) in Claims, and estimates the fault location. Then, the flow ends.

Here, the flows of FIG. 4 and FIG. 5 are compared.

In the flow of FIG. 4, if there is a fault location in the photovoltaic string 3, fault diagnosis is executed without the attenuator 33 unless $T_1$ and $T_2$ are equivalent. In general, $T_1$ and $T_2$ are rarely equivalent if there is a fault. In addition, the labor to switch the connection of the signal generator 23 is rather not so large as that to connect the attenuator 33 newly to the photovoltaic string 3. Thus, the flow shown in FIG. 4 is useful when it is probable that the photovoltaic string 3 under test has a fault, such as the case where fault diagnosis of a particular photovoltaic system is executed according to the order from a user of the photovoltaic system.

In contrast, in the flow shown in FIG. 5, the attenuator 33 is connected to the photovoltaic string 3 from the beginning of the flow. If there is no fault location in the photovoltaic string 3, the flow requires only the switching behavior in the first switching step S2-1. Therefore, the flow shown in FIG. 5 is useful when it is probable the photovoltaic string under test is normal, such as the case of periodic diagnosis.

Next, as a simpler fault diagnosis method, the process for determining which photovoltaic module 5 has a fault is described.

That is, the memory unit 35 in FIG. 3 stores, in place of the string length $L_1$, the number $N_1$ of all the photovoltaic modules 5 of the photovoltaic string 3. And in the fault location estimation step S1-14 in FIG. 4 or in the fault location estimation step in S2-11 in FIG. 5, the computing unit 39 estimates the fault location to diagnose the photovoltaic string 3 by computing the number $N_x$ of the photovoltaic modules from the positive terminal or the negative terminal to the fault location based on the following formula: $N_x=N_1*T_1/(T_1+T_2)$, corresponding to formula (2) in Claims.

This simple process makes it easier, compared with the processes in FIG. 4 and FIG. 5, to identify the photovoltaic module which has a fault. Thus, this simple process is useful when the object is just to find the photovoltaic module which has a fault such as the case where the fault diagnosis method is executed for the purpose of changing the faulty photovoltaic module for a new one.

In the following, simulation is described where the fault diagnosis method described above is applied for the model of the photovoltaic string 3.

Figure 6:
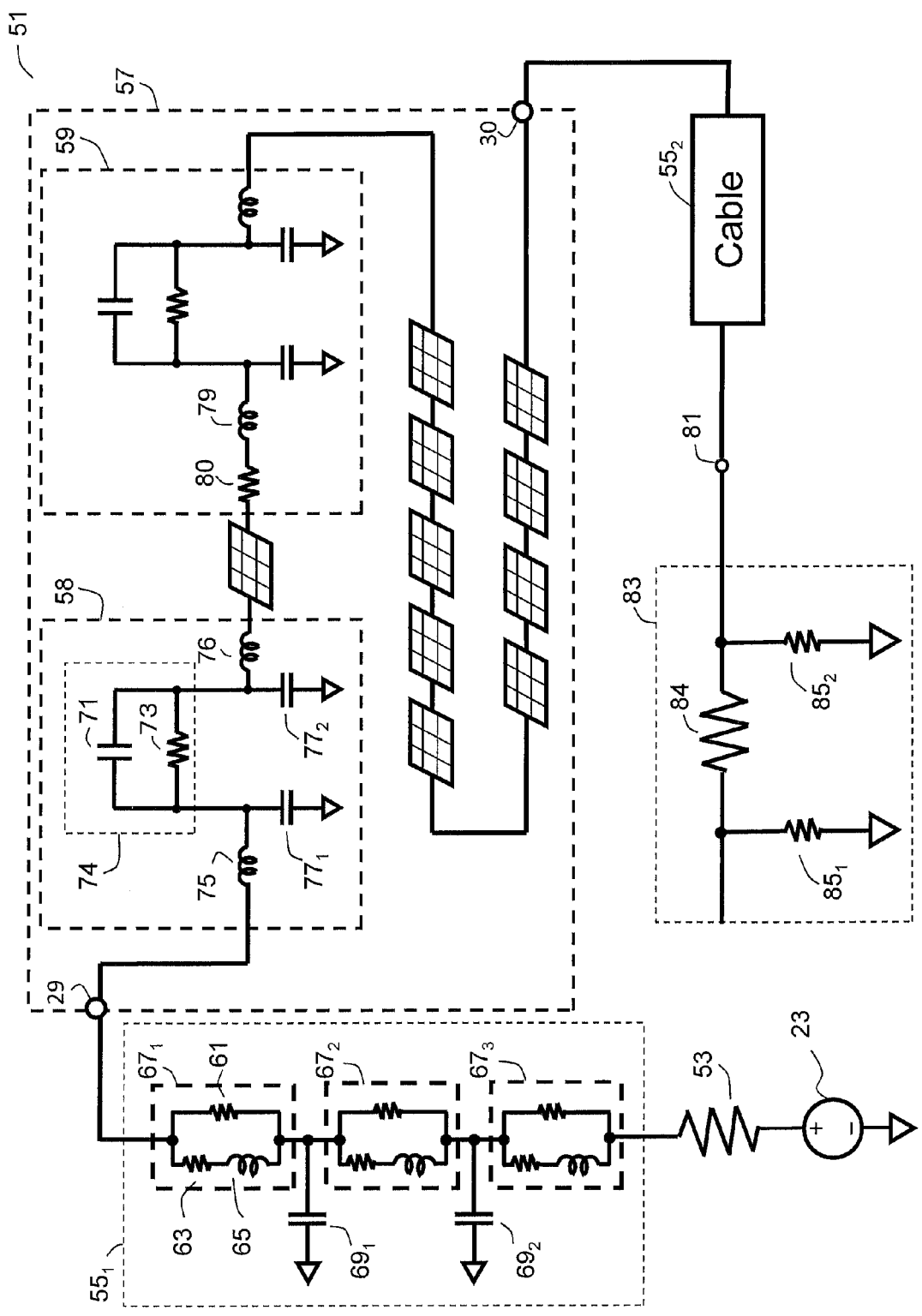
FIG. 6 shows an example of simulation model.
Figure 7:
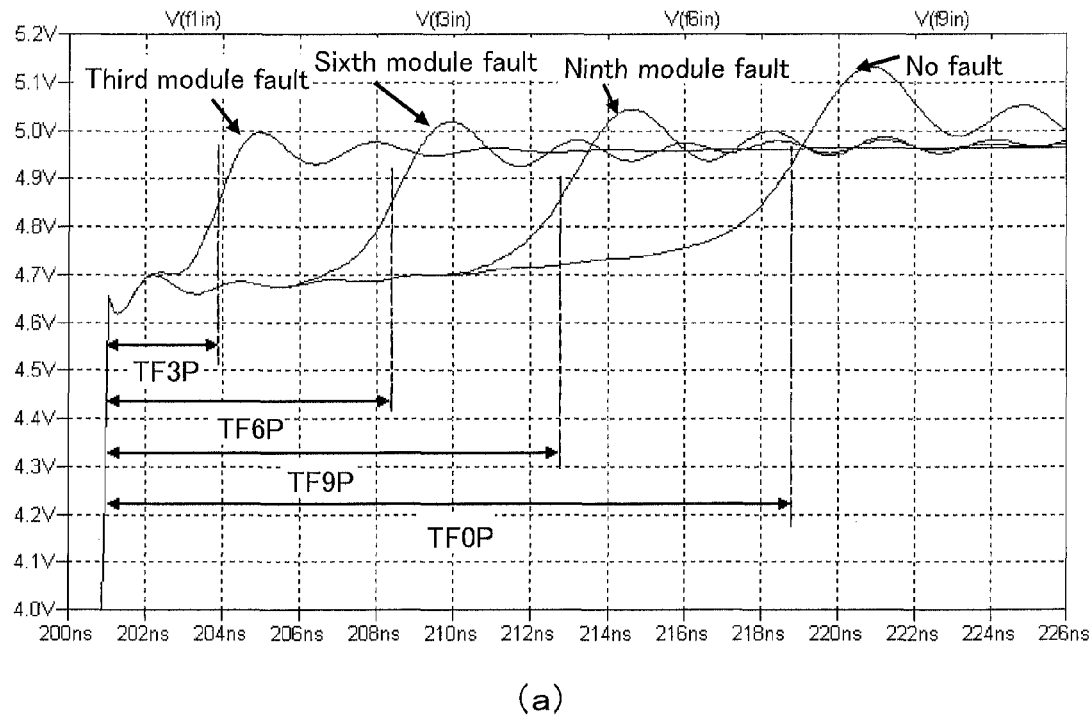
FIG. 7 shows an example of the positive terminal output signal and the negative terminal output signal when an attenuation model 83 is not connected in the model in FIG. 6.
Figure 7:
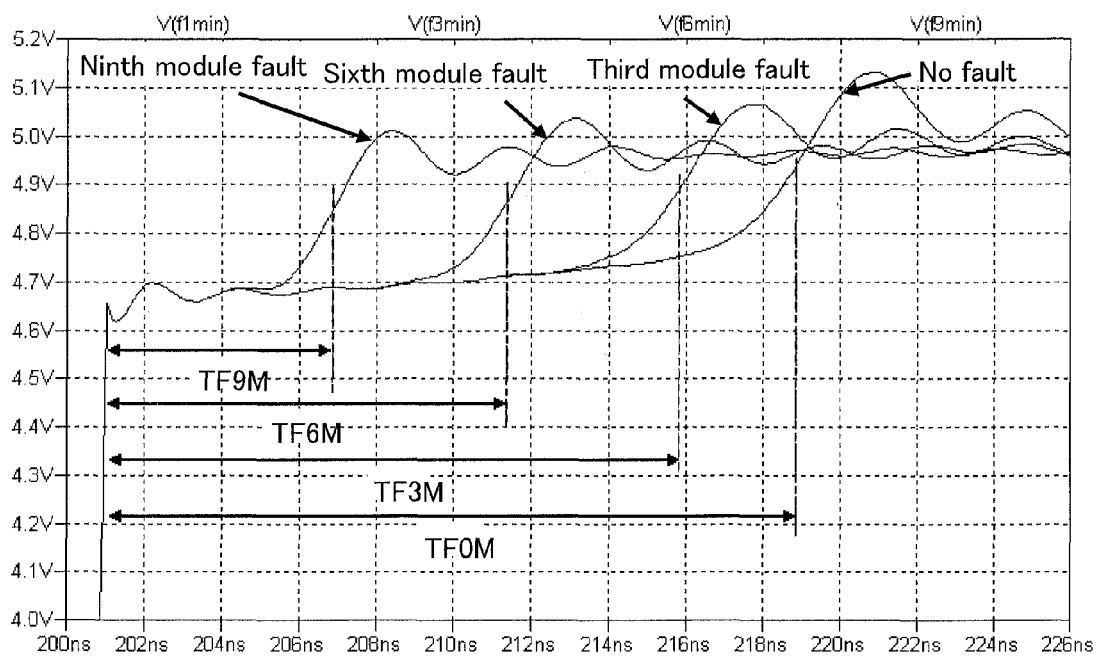

Referring to FIG. 6 and FIG. 7, an example of model used in the simulation is described. FIG. 6 shows an example of simulation model 51.

In the simulation model 51 shown in FIG. 6, a signal generator 23, a resistance 53, a cable model $55_1$ for the cable $7_1$, a photovoltaic string model 57 for the photovoltaic 3, a cable model $55_2$ for the cable $7_2$ are connected in series in this order. The end of the cable $55_2$ which is not connected is connected to the attenuator model 83 for the attenuator 33 via a connection terminal 81, or is not connected being an open end.

The input signal inputted from the signal generator 23 is reflected at a fault location of the photovoltaic string 57 or at the open end. The reflected signal is observed by the waveform observer 25 not shown in FIG. 6.

In the photovoltaic string model 57 in FIG. 6, the models for twelve photovoltaic modules 5 are connected in series. As the model for the photovoltaic module 5, a normal model 58 for a normal photovoltaic module is distinguished from a faulty model 59 for a faulty photovoltaic module. In FIG. 6, the positive terminal 29 of the photovoltaic string model 57 is connected toward the signal generator 23. And it is given that the third photovoltaic module from the positive terminal 29 has a fault. When an input signal is inputted from the negative terminal 30 of the photovoltaic string model 57, the negative terminal 30 is connected toward the signal generator 30.

In the cable model 551 in FIG. 6, a resistance 61 connected in parallel with a resistance 63 and a coil 65 connected in series forms a partial circuit 67. Three partial circuits $67_1$, $67_2$ and $67_3$ are connected in series in this order. The two paths between the three partial circuits $67_1$, $67_2$ and $67_3$ are branched to be grounded via a capacitor $69_1$ and a capacitor $69_2$, respectively.

In the normal model 58 in FIG. 6, a capacitor 71 and a resistance 73 are connected in parallel to form a partial circuit 74, and a coil 75, the partial circuit 74, and a coil 76 are connected in series in this order. The two paths between the coil 75, the partial circuit 74 and the coil 76 are branched to be grounded via a capacitor $77_1$ and a capacitor $77_2$, respectively.

The faulty model 59 in FIG. 6 is different from the normal model 58 in having high resistance around the positive terminal due to the fault. That is, in the faulty model 59, a resistance 80 is connected between the normal model and a coil 79, corresponding to the coil 75 in the normal model 58. The resistance 80 expresses the high resistance due to the fault.

In the attenuator model 83 in FIG. 6, the connection terminal 81 and a resistance 84 are connected in series. The other end of the resistance 84 is an open end. The two paths between the connection terminal 81, the resistance 84 and the open end are branched to be grounded via a capacitor $85_1$ and a capacitor $85_2$, respectively. The signal inputted into the attenuator flow s to the grounded branches and reflection does not occur.

Next, referring to FIG. 7, the process to diagnose a fault location based on the output signal observed by the waveform observer 25 is described. The FIG. 7 shows an example of (a) the positive terminal output signal and (b) the negative terminal output signal when an attenuation model 83 is not connected.

In FIG. 7(a), the positive terminal output signals of the case where there is a fault at the third, sixth or the ninth photovoltaic module from the positive terminal among the twelve photovoltaic modules 5 of the photovoltaic string model 57 and the positive terminal output signal out of the normal photovoltaic string model are shown. TF3P, TF6P, TF9P and TF0P denote the positive terminal reflection times which are amounts of time from inputting an positive terminal input signal to the inflection point of rising of each positive terminal output signal. It is shown in FIG. 7(a) TF3P<TF6P<TF9P<TF0P, which matches the order of the lengths of signal path from inputting an input signal via reflection in the photovoltaic string 3 to the observation.

As well, in FIG. 7(b), the negative terminal output signals of the case where there is a fault at the third, sixth or the ninth photovoltaic module from the positive terminal and the negative terminal output signal out of the normal photovoltaic string model are shown. The negative terminal reflection times defined as well are denoted by TF0M, TF3M, TF6M and TF9M. It is shown in FIG. 7(b) TF9M<TF6M<TF3M<TF0M, which also matches the order of the lengths of signal path from inputting an input signal via reflection in the photovoltaic string 3 to the observation.

Figure 8:
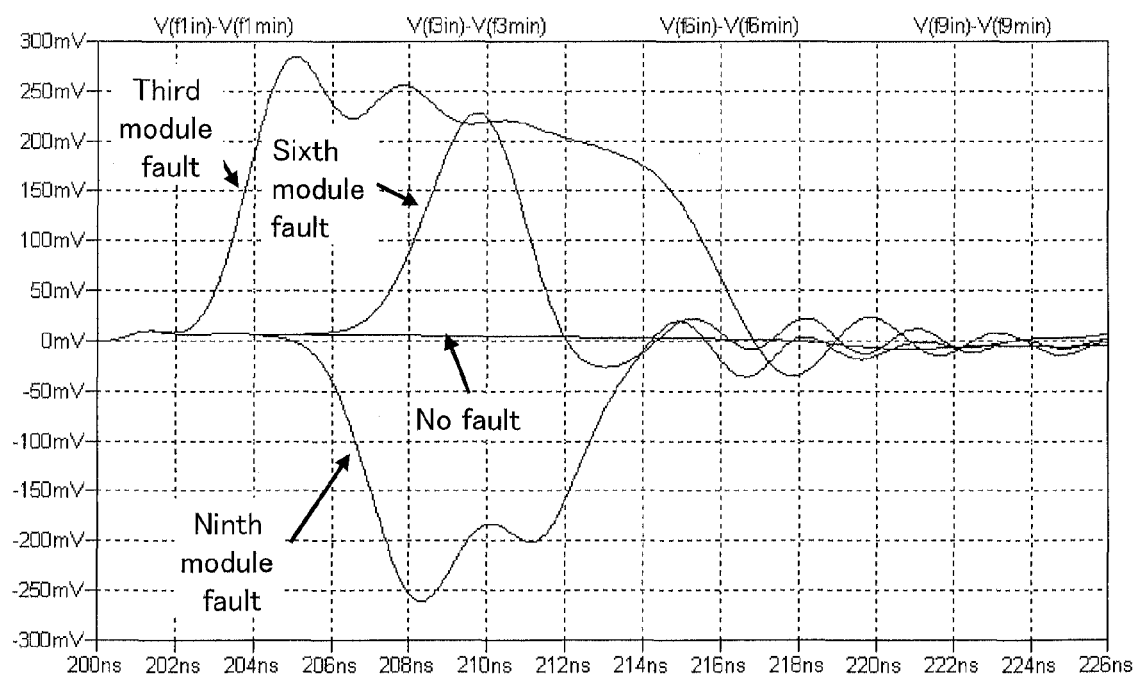
FIG. 8 shows a difference waveform made by distracting the negative terminal output signal from the positive terminal output signal in FIG. 7.
Figure 9:
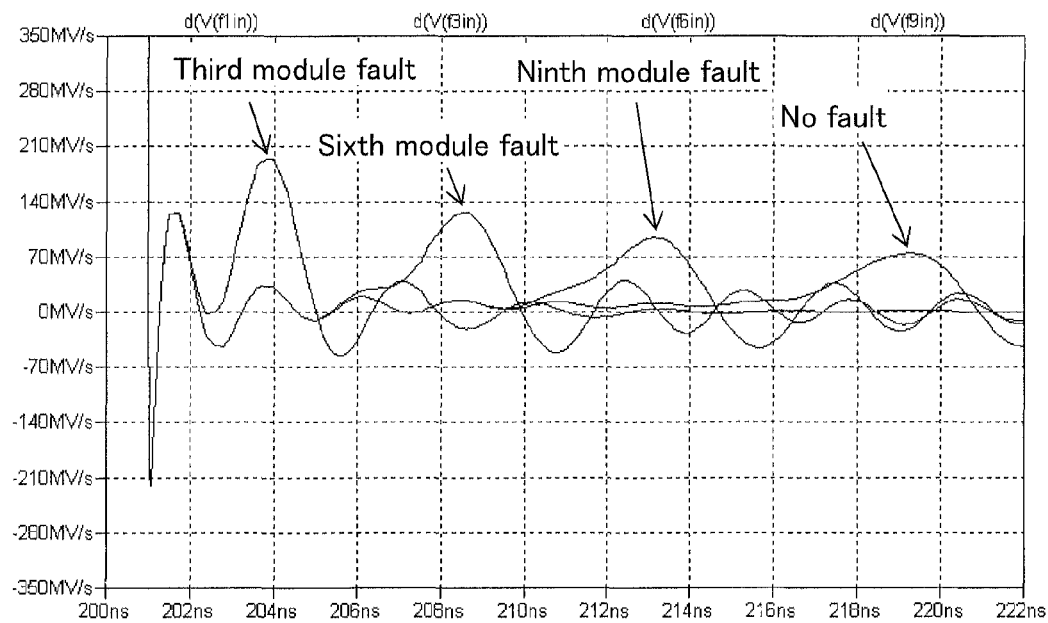
FIG. 9 shows a differentiated waveform of the positive terminal output signal and the negative terminal output signal in FIG. 7.
Figure 9:
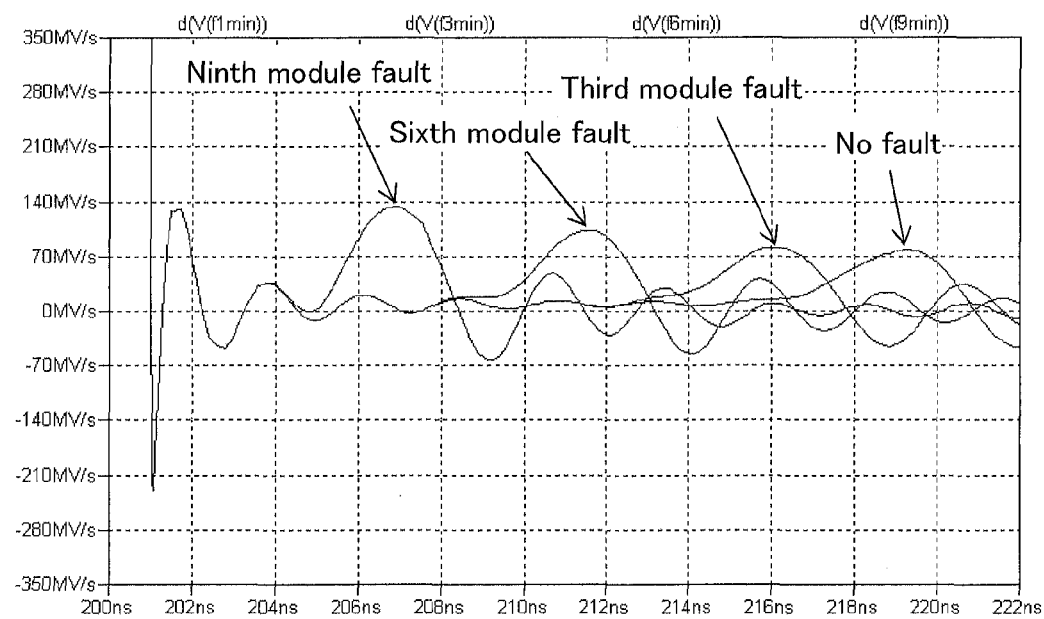

Here, referring to FIG. 8 and FIG. 9, two methods for determining reflection time from an output signal are described. FIG. 8 shows an example of a difference waveform made by distracting the negative terminal output signal from the positive terminal output signal. FIG. 9 shows an example of a differentiated waveform of (a) the positive terminal output signal and (b) the negative terminal output signal.

The first method is obtaining the reflection time from the inflection point of the difference waveform made by distracting the negative terminal output signal from the positive terminal output signal. In FIG. 8, the voltage of the difference waveform becomes mainly positive when the photovoltaic modules near the positive terminal 29 have a fault, corresponding to the case where the third or the sixth photovoltaic module has a fault. In contrast, the voltage of the difference waveform becomes mainly negative when the photovoltaic module near the negative terminal 30 has a fault, corresponding to the case where the ninth photovoltaic module has a fault. For each case, the positive terminal reflection time is determined from the inflection point of rising of the difference waveform and the negative terminal reflection time is determined from the inflection point of falling of the difference waveform.

The second method is obtaining the reflection time from the local maximum value of a differentiated waveform of an output signal. The inflection point of an output signal waveform corresponds to the local maximums of the differentiated waveforms shown in FIG. 9(a) and FIG. 9(b). The positive terminal reflection time and the negative terminal reflection time are determined from these local maximum values. The local maximum is easier to identify from a waveform than an inflection point. Thus, it is more favorable to use a differentiated waveform than a difference waveform for accurate identification of reflection time.

Next, referring to Table 1 and Table 2, the estimation result (first estimated fault location in Table 2) of the fault location is described, utilizing the formula described as a simple process, corresponding to the formula (2) in Claims, based on the reflection time (first measurement in Table 1) obtained from the number of photovoltaic modules (twelve) and the differentiated waveform of the output signal waveform in FIG. 9.

The reflection times are computed from the differentiated waveform of the output signal waveform in FIG. 9, as shown in the first measurements in Table 1. As shown in the first estimated fault location, the computed values showing the estimated fault location fall within 5% of the anticipated values. This is accurate enough for diagnosing which photovoltaic module has a fault in a photovoltaic string.

Here, if there is a fault in the middle of the photovoltaic string 3 under test, the waveforms of the positive terminal output signal and the negative terminal output signal shown in FIG. 7 as an example become similar. Thus, the difficulty is expected in distinguishing from the normal photovoltaic string.

Figure 10:
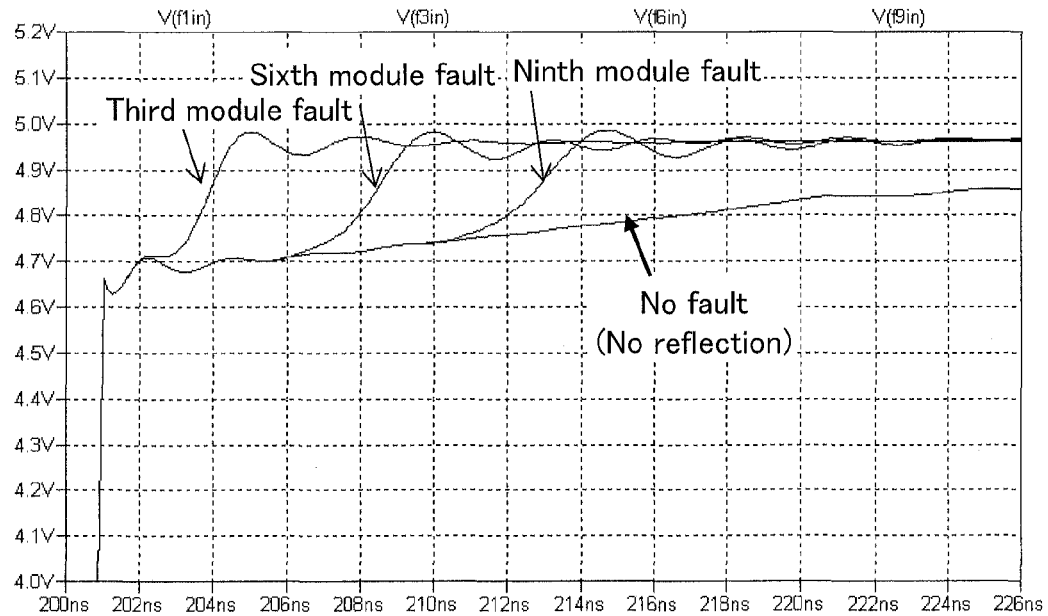
FIG. 10 shows an example of the positive terminal output signal and the negative terminal output signal when an attenuation model 83 is connected.
Figure 10:
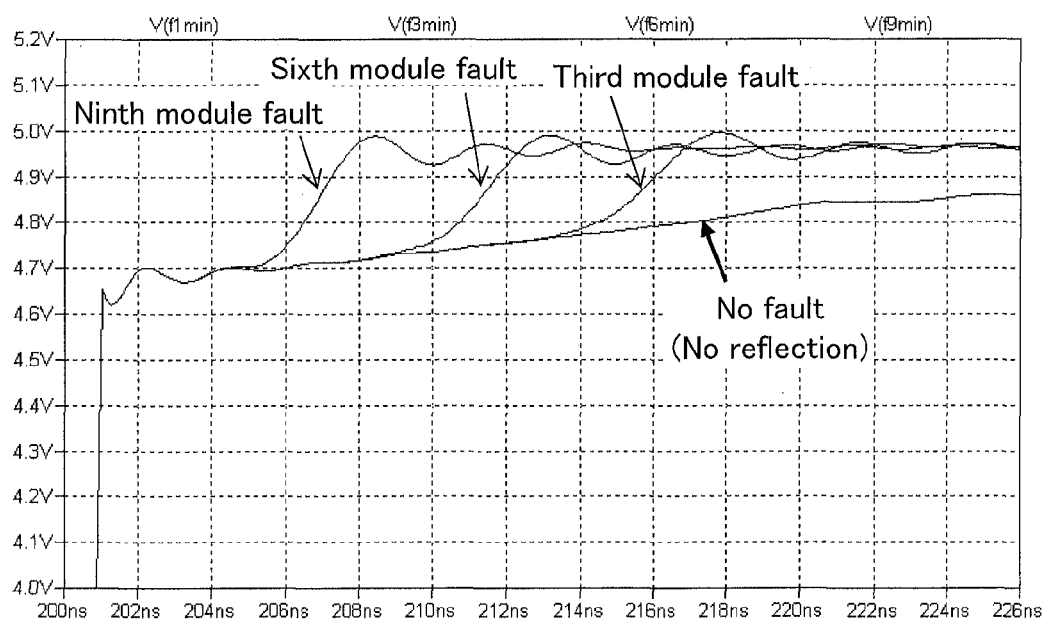

Then, referring to FIG. 10, Table 1 and Table 2, the fault diagnosis method is described where the attenuator model 83 is connected. FIG. 10 shows an example of (a) the positive terminal output signal and (b) the negative terminal output signal when the attenuation model 83 is connected.

In FIG. 10, there is no rising in the output signal from the normal photovoltaic string 3, because there is no reflected wave since the attenuator model 83 attenuates a signal. In contrast, the output waveforms from the photovoltaic string 3 which has a fault in the third, sixth or ninth photovoltaic module have rising as well as the waveforms in FIG. 7.

As described above, the output signal waveform in case of no reflection can be clearly distinguished from that in case of including reflected wave. Thus, connecting the attenuator model 83 enables to distinguish the normal photovoltaic string 3 and the photovoltaic string 3 with a fault in the middle (Refer to the second determining step S1-13 in FIG. 4 and the determining step S2-4 in FIG. 5). In addition, as shown in the second measurements in Table 1 and the second estimated fault location in Table 2, the computed values fall within 5% of the anticipated values in the simulation where the attenuated model 83 is connected, too.

As described above, the fault location of the photovoltaic string 3 under test can be identified with enough accuracy, without a corresponding normal photovoltaic string.

TABLE 1

Reflection time

| Parameter | First measurements (ns) | Second measurements (ns) |
|---|---|---|
| TF3P | 3.28 | 3.28 |
| TF6P | 8.00 | 8.00 |
| TF9P | 12.60 | 12.58 |
| TF0P | 18.68 | No Reflection |
| TF3M | 15.50 | 15.48 |
| TF6M | 10.98 | 10.99 |
| TF9M | 6.34 | 6.34 |
| TF0M | 18.68 | No Reflection |

TABLE 2

Fault location estimation

| Fault location | Anticipated value | First estimated fault location | Second estimated fault location |
|---|---|---|---|
| Third | 2.00 | 2.09 | 2.10 |
| Sixth | 5.00 | 5.06 | 5.06 |
| Ninth | 8.00 | 7.99 | 7.98 |

Example 2

Figure 11:
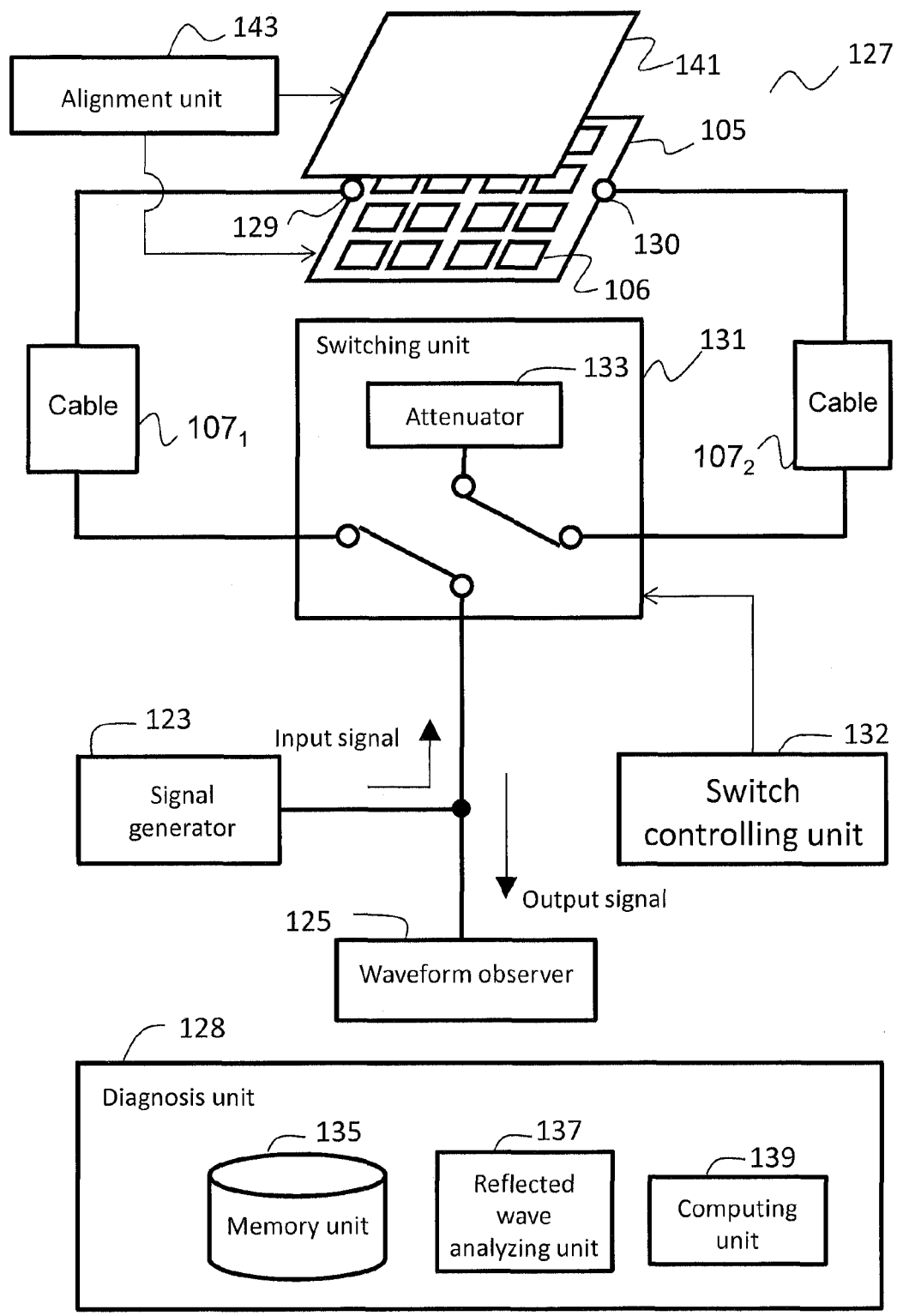
FIG. 11 shows a schematic block diagram illustrating another example of the fault diagnosis system in accordance with the present invention.

Next, another example of the fault diagnosis system in accordance with the present invention is described. FIG. 11 shows a schematic block diagram illustrating another example of the fault diagnosis system 127 (an example of "fault diagnosis system" in Claims) in accordance with the present invention. In the following, the difference from the fault diagnosis system 27 is mainly described.

The fault diagnosis system 127 includes a signal generator 123 (an example of "signal generator" in Claims), a waveform observer 125 (an example of "waveform observer" in Claims), a diagnosis unit 128 (an example of "diagnosis unit" in Claims), switching unit 131 (an example of "switching unit" in Claims), and a switch controlling unit 132 (an example of "switch controlling unit" in Claims). The signal generator 123 generates and inputs an input signal into the photovoltaic string 3 under test. The waveform observer 125 observes an output signal reflected from a photovoltaic module 105 when the input signal is inputted into the photovoltaic module 105. The diagnosis unit 128 diagnoses the photovoltaic module 105 by estimating the fault location of the photovoltaic module 105 based on the output signal observed by the waveform observer 125. The switching unit 131 switches the connection between the signal generator 123 and a positive terminal 129 or a negative terminal 130 of the photovoltaic module 105. Additionally, the switching unit 131 switches the connection between the waveform observer 125 and the positive terminal 129 or the negative terminal 130. The switch controlling unit 132 controls the connection behavior of the switching unit 131.

The switching unit 131 includes an attenuator 133 (an example of "attenuator" in Claims). The attenuator 133 can be connected to a terminal opposite to one of the positive terminal 129 and the negative terminal 130 to which the signal generator 123 and the waveform observer 125 are connected. The switch controlling unit 132 controls the switching unit 131 to switch the connection between the attenuator 133 and the photovoltaic module 105. The terminal opposite to the one connected with the signal generator 123 and the waveform observer 125 is connected to the attenuator 133 or is an open end without being connected to the attenuator 133.

The diagnosis unit 128 includes a memory unit (an example of "memory unit" in Claims), a reflected wave analyzing unit 137 (an example of "reflected wave analyzing unit" in Claims) and a computing unit 139 (an example of "computing unit" in Claims). The memory unit 135 stores the transmission distance which is a distance from the positive terminal 129 to the negative terminal 130 of the photovoltaic module 105. The reflected wave analyzing unit 137 analyzes the positive terminal output signal and the negative terminal output signal observed by the waveform observer 125. Additionally, the reflected wave analyzing unit 137 determines the positive terminal reflection time and the negative terminal reflection time and make the memory unit 135 store them. The computing unit 139 computes the distance from the positive terminal 129 or the negative terminal 130 to a fault location. Here, The computing unit 139 computes based on the positive terminal reflection time and the negative terminal reflection time as well as on the transmission distance.

The fault diagnosis system 127 further includes, in addition to the configuration of the fault diagnosis system 27, a metal plate 141 (an example of "conductive body" in Claims) and an alignment unit 143 (an example of "alignment unit" in Claims) for controlling the positions of the metal plate 141 and/or the photovoltaic module 105. Here, it is favorable to utilize the metal plate 141 which is larger than the photovoltaic cell 106 of the photovoltaic module 105 in area and is stable in thickness. Then, the metal plate 141 has metal atoms (an example of "conductive substance" in Claims) arranged in a periodic way. And it can be said that the conductive substance is arranged so that it has the same translational symmetry with that of the photovoltaic cell 106.

The fault diagnosis system 127 diagnoses at least one photovoltaic module 105 (an example of "photovoltaic module" in Claims). The photovoltaic module 105 has pluralities of photovoltaic cells 106 (an example of "photovoltaic cell" in Claims). The photovoltaic module 105 includes a metal frame. Thus, there occurs capacitance not uniformly in the pluralities of photovoltaic cells 106. That is, a large capacitance is caused on the periphery of the photovoltaic module 105 near the metal frame, and smaller capacitance is caused in the photovoltaic cell in the middle region which is farther from the metal frame.

The signal generator 123 of the fault diagnosis system 127 generates and inputs a signal into the photovoltaic module 105 while the alignment unit 143 puts the metal plate 141 close to the photovoltaic module 105 in parallel with the photovoltaic cell 106. That is, the fault diagnosis system 127 diagnose a device under test (an example of "device under test" in Claims) which is the combination of the photovoltaic module 105 and the metal plate 141 which is a different body from the photovoltaic module 105. The metal plate 141 cause a uniform capacitance C with each of the photovoltaic cells 106 to increase the capacitance C in the formula (3), increasing the time t necessary for a signal to propagate. That is, the propagation speed of a signal can be controlled to slow down. Thus, the fault diagnosis of high resolution is possible without a high-speed pulse generator or a high-speed waveform observer.

Here, when the metal plate 141 is arranged as described above, the alignment unit 143 brings the same substance of the same area by the same distance to each of pluralities of cell spaces (an example of "cell spaces" in Claims) which corresponds to the spaces with acceptance surfaces of the photovoltaic cells being translated perpendicular to the acceptance surfaces. Thus, the alignment unit 143 brings the metal plate 141 close to the photovoltaic module 105 so that such amount of conductive substance is included in each of cell spaces that cause uniform capacitance between the conductive body and each of the photovoltaic cells.

As a result of the metal plate 141 being close to the photovoltaic module 105, the capacitance caused all over the photovoltaic module 105 can be increased uniformly. Then, the influence of the capacitance formed between the metal frame of the photovoltaic 105 and each of the photovoltaic cell 106 become relatively smaller. Thus, it is made possible to cause more uniform capacitance C in the photovoltaic module, which leads to more uniform signal propagation speed. The uniformity may be judged utilizing the root-mean-square deviation or the like of the capacitances caused in each of the photovoltaic cells 106 as standard.

Figure 12:
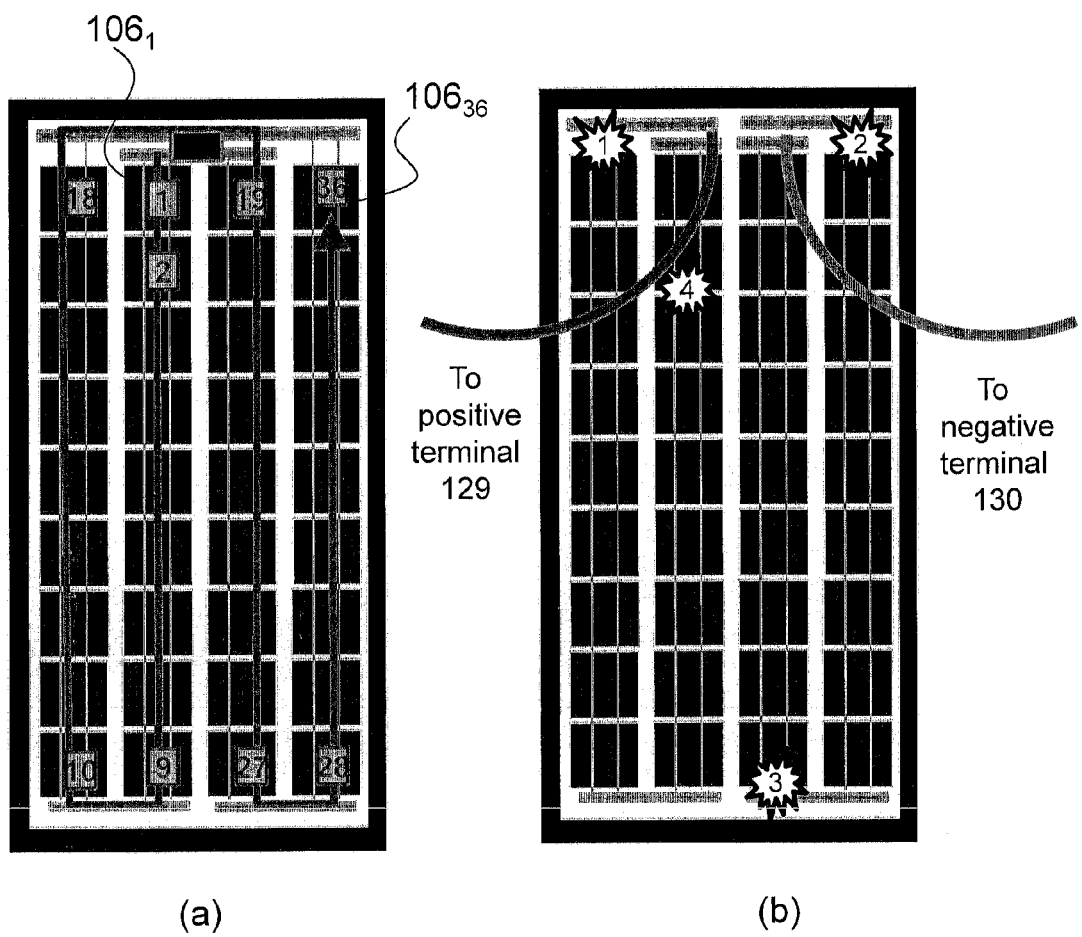
FIG. 12 shows a schematic diagram illustrating an example of a photovoltaic module having photovoltaic cells connected in series.

Next, the experimental result of utilizing the fault diagnosis system 127 is described. FIG. 12 shows a schematic diagram illustrating an example of the photovoltaic module 105 shown in FIG. 11. FIG. 12(a) shows the connection order of the photovoltaic cells connected in series. FIG. 12(b) shows the site assumed as a fault location. In this experiment, the photovoltaic module 105 has 36 cells (nine per line, four lines) and two substrings.

The photovoltaic modules 105 shown in FIG. 12(a) has 36 photovoltaic cells $106_n$ (n=1, 2 . . . 36). The photovoltaic $106_n$ are connected in series from $106_1$ through $106_{36}$ in this order. The photovoltaic cell $106_1$ is connected to the positive terminal 129 shown in FIG. 11, and the photovoltaic cell $106_{36}$ is connected to the negative terminal 130.

Here, as shown in FIG. 12(b), the experiment is executed, given that the photovoltaic module 105 has five fault locations. That is, (1) a fault between the eighteenth cell and the nineteenth cell and (2) unstuck solder (break) between the thirty sixth module and the negative terminal 130 are assumed as faults near angles of the photovoltaic 105. And (3) an unstuck solder (break) between the twenty seventh module and the twenty eighth module is assumed as a fault near the middle of side of the metal frame of the photovoltaic module 105. Additionally, (4) an unstuck solder (break) between the second module and the third module is assumed as a fault in the middle of the photovoltaic module 105. Further, (5) a break of the positive terminal 129 is assumed. It is examined if the fault diagnosis system can diagnose the fault locations assumed above with/without the metal plate 141. The fault locations corresponding to (1) through (4) are shown in FIG. 12(b).

The experimental result is summarized in Table 3.

TABLE 3

| | | Without metal plate | | With metal plate | |
| --- | --- | --- | --- | --- | --- |
| Fault location | Anticipated value (number of cell) | Estimated location (number of cell) | Propagation time per cell (ns) | Estimated location (number of cell) | Propagation time per cell (ns) |
| (1) upper left | 18.0 | 17.1 | 1.82 | 18.0 | 8.51 |
| (2) upper right | 36.0 | 27.9 | 1.52 | 34.38 | 7.68 |
| (3) lower | 27.0 | 18.9 | 1.87 | 25.2 | 7.96 |
| (4) middle | 2.0 | 8.73 | 1.78 | 3.69 | 7.42 |
| (5) positive terminal | 0.0 | 9.18 | 1.11 | 1.44 | 7.12 |

As shown in Table 3, the signal propagation speed is slower when the metal plate is utilized. Concretely, the signal propagation speed per cell is 1.11-1.87 [ns] in case of without the metal plate. In contrast, the signal propagation speed per cell becomes 7.12-8.51 [ns] with the metal plate, which is four times as slower as without metal plate or more. According to the formula (3), the capacitance caused in the photovoltaic cell becomes sixteen times as large or more by bringing the metal plate close to the photovoltaic cells. As a result, the resolution becomes higher and closer "estimated location" to the accurate "Assumed location" is computed with the metal plate. For example, 27.9 is obtained as a computed fault location without the metal plate for the fault in upper right area (thirty sixth cell). In contrast, 34.38 is obtained as a computed fault location with the metal plate. As for the other fault locations, too, the error of estimating fault location is within 9 cells in case of without the metal plate, compared with within 2 cells in case of with the metal plate.

Here, the fault diagnosis system of Example 1 through 3 may include the signal generator 23 for each of the positive terminal 29 and the negative terminal of the photovoltaic string 3. Similarly, the fault diagnosis system of Example 1 through 3 may include the waveform observer 25 for each of the positive terminal 29 and the negative terminal of the photovoltaic string 3.

Additionally, the signal generator may input different input signals for the positive terminal and the negative terminal of the photovoltaic module for the purpose of making it easy to identify into which terminal the input signal that caused the observed signal is inputted. For example, the signal generator may input a convex pulse to one terminal and a calathiform pulse to the other terminal.

Further, the conductive body may be different from a metal plate as long as the conductive body can cause uniform capacitance with each of the photovoltaic cells of the photovoltaic module. Here, the capacitance C caused by the combination of a photovoltaic cell and a conductive body of stable thickness in a cell space is expressed by $C=Q/V=\epsilon S/d$. Here, Q denotes charge [C] stored in the conductive body, V denotes the voltage [V] between the conductive body and the photovoltaic cell, s denotes dielectric constant of the substance between the conductive body and the photovoltaic cell, S denotes the area of the conductive body or the photovoltaic cell and d denotes the distance between the conductive body and the photovoltaic cell. The substance with high conductivity such as Iron or Aluminum is favorable as the substance of the conductive body, though not restricted to these substances. The substance of the conductive body may be other than metal.

Further, the conductive body may not be a plate but a block of conductive substance as long as the conductive body causes uniform capacitance in each of the photovoltaic cells. For example, a metal desk in place of the metal plate may be utilized when the signal generator inputs an input signal so that the surface of the photovoltaic module where the photovoltaic cells are put on faces the metal desk. Then, the alignment unit may move not the conductive body but the photovoltaic module to bring the conductive body and the photovoltaic module closer. Further, the conductive body may not be a plate but net-like. Or the conductive body may be a shelf which can store pluralities of photovoltaic modules.

Further, the conductive body may cause uniform capacitance in each of the photovoltaic cells as a result. For example, the conductive body may be put closer in a focused way to the area where relatively smaller capacitance is caused due to being far from the metal frame, in order to decrease the variance of capacitance caused all over the photovoltaic module.

Further, for convenience when a mobile type of the fault diagnosis system of a photovoltaic module is designed, the conductive body may be connected to the signal generator and/or the waveform observer. Then, the conductive body may be a film which can be bent when carried.

Further, the alignment unit may bring the conductive body closer to the photovoltaic module from any direction. The alignment unit may bring both of them closer along the direction perpendicular to the acceptance surface of the photovoltaic module, along the direction in parallel with the acceptance surface, or along other directions.

Further, the photovoltaic module may be different from one with metal only in its frame. For example, the photovoltaic module may have a metal frame in areas other than edges such as middle area. The terminal box of the photovoltaic module may be metal. The frames or the terminal box may be other than metal.

Further, the conductive body may be grounded by the alignment unit, the signal generator, waveform observer or other devices.

Further, the fault diagnosis system 27 and the fault diagnosis system 127 may be utilized at the same time for the diagnosis as a step of manufacturing photovoltaic strings before shipping. That is, the photovoltaic string may be diagnosed by the fault diagnosis system 27 at first to diagnose if there is fault or not and which panel if any. Next, the fault diagnosis system 127 may identify the fault location of the photovoltaic module diagnosed as faulty. Then, only a minimum alignment of the conductive body is enough. The fault diagnosis system 27 or the fault diagnosis system 127 may further include a system switching device for finding the photovoltaic module to be diagnosed in detail among the photovoltaic string under test and for making the fault diagnosis system 127 diagnose further.

REFERENCE SIGNS LIST 3 photovoltaic string, 5&105 photovoltaic module, 23&123 signal generator, 25&125 waveform observer, 27&127 fault diagnosis system, 28&128 diagnosis unit, 31&131 switching unit, 32&132 switch controlling unit, 33&133 attenuator, 35&135 memory unit, 37&137 reflected wave analyzing unit, 39&139 computing unit, 141 metal plate, 143 alignment unit

The invention claimed is:

1. A fault diagnosis system for diagnosing a photovoltaic array having a photovoltaic string having pluralities of photovoltaic modules connected in series by estimating a fault location of the photovoltaic array, comprising:
   a signal generator for generating a positive terminal input signal which is an input signal into the photovoltaic string when the signal generation device is connected not to a negative terminal but to a positive terminal of the photovoltaic string and for generating a negative terminal input signal which is an input signal into the photovoltaic string when the signal generation device is connected not to a positive terminal but to a negative terminal of the photovoltaic string;
   a waveform observer for observing a positive terminal output signal which is outputted from the positive terminal as a reflected wave of the positive terminal input signal and for observing a negative terminal output signal which is outputted from the negative terminal as a reflected wave of the negative terminal input signal; and a diagnosis unit for estimating the fault location based on the positive terminal output signal and the negative terminal output signal observed by the waveform observer, wherein the diagnosis unit includes:

a memory unit for storing a string length which is distance between the positive terminal and the negative terminal of the photovoltaic string;

a reflected wave analyzing unit for analyzing the positive terminal output signal and the negative terminal output signal observed by the waveform observer, for determining positive terminal reflection time which is amount of time from inputting the positive terminal input signal to observing the positive terminal output signal and negative terminal reflection time which is amount of time from inputting the negative terminal input signal to observing the positive terminal output signal, and for making the memory unit store the positive terminal reflection time and the negative terminal reflection time; and a computing unit for estimating distance from the positive terminal or from the negative terminal to the fault location based on the string length and the positive terminal reflection time and the negative terminal reflection time.

2. The fault diagnosis system of claim 1, further comprising:

an attenuator for attenuating signal transferred in the photovoltaic string not to cause reflection when connected to the photovoltaic string;

a switching unit for switching connection between the positive terminal or the negative terminal and the signal generator or the attenuator; and a switch controlling unit for controlling connection behavior of the switching unit, wherein the reflected wave analyzing unit determines the positive terminal reflection time and the negative terminal reflection time by analyzing a reflected wave of an input signal inputted by the signal generator when the switch controlling unit controls the switching unit to connect one of the positive terminal and the negative terminal to the signal generator and not to connect the attenuator either the positive terminal or the negative terminal, and by analyzing a reflected wave of an input signal inputted by the signal generator when the switch controlling unit controls the switching unit to connect the other of the positive terminal and the negative terminal to the signal generator and not to connect the attenuator either the positive terminal or the negative terminal, wherein, if the positive terminal reflection time and the negative terminal reflection time are determined to be different, the diagnosis unit estimates the distance from the positive terminal or from the negative terminal to the fault location based on the string length and the positive terminal reflection time and the negative terminal reflection time, and wherein, if the positive terminal reflection time and the negative terminal reflection time are determined to be equivalent, the switch controlling unit controls the switching unit to connect a terminal, opposite to a terminal which is connected to the signal generator, to the attenuator, the waveform observer observes a reflected wave of an input signal inputted by the signal generator, the reflected wave analyzing unit determines whether reflection is caused or not, wherein, if the reflection is determined to be caused, the diagnosis unit estimates the distance from the positive terminal or from the negative terminal to the fault location based on the string length and the positive terminal reflection time and the negative terminal reflection time, and wherein, if the reflection is determined not to be caused, the diagnosis unit diagnoses the photovoltaic string as normal.

3. The fault diagnosis system of claim 1, further comprising:

an attenuator for attenuating signal transferred in the photovoltaic string not to cause reflection when connected to the photovoltaic string;

a switching unit for switching connection between the positive terminal or the negative terminal and the signal generator or the attenuator; and a switch controlling unit for controlling connection behavior of the switching unit, wherein the switch controlling unit controls the switching unit to connect one of the positive terminal and the negative terminal to the signal generator and to connect the other terminal to the attenuator, wherein the reflected wave analyzing unit determines whether reflection of an input signal inputted by the signal generator is caused or not, wherein, if the reflection is determined not to be caused, the diagnosis unit diagnoses the photovoltaic string as normal, wherein, if the reflection is determined to be caused, the reflected terminal analyzing unit determines the positive terminal reflection time and the negative terminal reflection time by analyzing a reflected wave of an input signal inputted by the signal generator, and by analyzing a reflected wave of an input signal inputted by the signal generator when the switch controlling unit controls the switching unit to connect the other terminal to the signal generator, and the diagnosis unit estimates the fault location.

4. The fault diagnosis system of claim 1, wherein the photovoltaic array has pluralities of the photovoltaic strings connected in parallel, and wherein the fault diagnosis system further comprises:

a relay unit for switching connection between the signal generator and any of the pluralities of the photovoltaic strings; and a relay controlling unit for controlling the relay unit to switch the connection so that only a photovoltaic string under test is connected to the signal generator.

5. A fault diagnosis method utilizing a fault diagnosis system for diagnosing a photovoltaic array having a photovoltaic string having pluralities of photovoltaic modules connected in series by estimating a fault location of the photovoltaic array, wherein the fault diagnosis system includes:

a signal generator for generating a positive terminal input signal which is an input signal into the photovoltaic string when the signal generation device is connected not to a negative terminal but to a positive terminal of the photovoltaic string and for generating a negative terminal input signal which is an input signal into the photovoltaic string when the signal generation device is connected not to a positive terminal but to a negative terminal of the photovoltaic string;

a waveform observer for observing a positive terminal output signal which is outputted from the positive terminal as a reflected wave of the positive terminal input signal and for observing a negative terminal output signal which is outputted from the negative terminal as a reflected wave of the negative terminal input signal; and a diagnosis unit for estimating the fault location based on the positive terminal output signal and the negative terminal output signal observed by the waveform observer, wherein the diagnosis unit includes a memory unit for storing a string length $L_1$ which is distance between the positive terminal and the negative terminal of the photovoltaic string, and wherein the diagnosis method comprises:

analyzing, by a reflected wave analyzing unit of the diagnosis unit, the positive terminal output signal and the negative terminal output signal observed by the waveform observer, determining positive terminal reflection time $T_1$ which is amount of time from inputting the positive terminal input signal to observing the positive terminal output signal and negative terminal reflection time $T_2$ which is amount of time from inputting the negative terminal input signal to observing the positive terminal output signal, and for making the memory unit store the positive terminal reflection time and the negative terminal reflection time; and computing, by a computing unit of the diagnosis unit, distance $L_x$ from the positive terminal or from the negative terminal to the fault location based on formula (1) to estimate the fault location of the photovoltaic string $$L_x = L_1 \times \frac{T_1}{T_1 + T_2}. \tag{1}$$

6. A fault diagnosis method utilizing a fault diagnosis system for diagnosing a photovoltaic array having a photovoltaic string having pluralities of photovoltaic modules connected in series by estimating a fault location of the photovoltaic array, wherein the fault diagnosis system includes:

a signal generator for generating a positive terminal input signal which is an input signal into the photovoltaic string when the signal generation device is connected not to a negative terminal but to a positive terminal of the photovoltaic string and for generating a negative terminal input signal which is an input signal into the photovoltaic string when the signal generation device is connected not to a positive terminal but to a negative terminal of the photovoltaic string;

a waveform observer for observing a positive terminal output signal which is outputted from the positive terminal as a reflected wave of the positive terminal input signal and for observing a negative terminal output signal which is outputted from the negative terminal as a reflected wave of the negative terminal input signal; and a diagnosis unit for estimating the fault location based on the positive terminal output signal and the negative terminal output signal observed by the waveform observer, wherein the diagnosis unit includes a memory unit for storing number $N_1$ of the photovoltaic modules in the photovoltaic string, and wherein the diagnosis method comprises:

analyzing, by a reflected wave analyzing unit of the diagnosis unit, the positive terminal output signal and the negative terminal output signal observed by the waveform observer, determining positive terminal reflection time $T_1$ which is amount of time from inputting the positive terminal input signal to observing the positive terminal output signal and negative terminal reflection time $T_2$ which is amount of time from inputting the negative terminal input signal to observing the positive terminal output signal, and for making the memory unit store the positive terminal reflection time and the negative terminal reflection time; and computing, by a computing unit of the diagnosis unit, the number $N_x$ of the photovoltaic modules from the positive terminal or from the negative terminal to the fault location based on formula (2) to estimate the fault location of the photovoltaic string $$N_x = N_1 \times \frac{T_1}{T_1 + T_2}. \tag{2}$$

7. A fault diagnosis method utilizing a fault diagnosis system for diagnosing photovoltaic modules by estimating a fault location of the photovoltaic modules, wherein the fault diagnosis system includes:

a signal generator for generating a positive terminal input signal which is an input signal into the photovoltaic modules when the signal generation device is connected not to a negative terminal but to a positive terminal of the photovoltaic modules and for generating a negative terminal input signal which is an input signal into the photovoltaic modules when the signal generation device is connected not to a positive terminal but to a negative terminal of the photovoltaic modules;

a waveform observer for observing a positive terminal output signal which is outputted from the positive terminal as a reflected wave of the positive terminal input signal and for observing a negative terminal output signal which is outputted from the negative terminal as a reflected wave of the negative terminal input signal;

a diagnosis unit for estimating the fault location based on the positive terminal output signal and the negative terminal output signal observed by the waveform observer;

a conductive body which causes capacitance with the photovoltaic modules; and an alignment unit for controlling position of the conductive body and/or the photovoltaic modules, wherein the diagnosis method comprises:

aligning, by the alignment unit, the position of the conductive body and/or the photovoltaic modules, generating and inputting, by the signal generator, the positive terminal input signal into the photovoltaic modules and observing, by the waveform observing unit, the positive terminal output signal, and generating and inputting, by the signal generator, the negative terminal input signal into the photovoltaic modules and observing, by the waveform observing unit, the negative terminal output signal, estimating, by a computing unit of the diagnosis unit, the fault location based on the positive terminal output signal and the negative terminal output signal.

8. The fault diagnosis method of claim 7, wherein, in the aligning, the alignment unit increases the capacitance between the conductive body and the photovoltaic modules by bringing the conductive body and the photovoltaic modules closer.

9. The fault diagnosis method of claim 8, wherein the photovoltaic modules further includes pluralities of photovoltaic cells with a variety of capacitances, and
wherein, in the aligning, the alignment unit decreases variation of capacitances of the pluralities of photovoltaic cells by bringing each photovoltaic cell and the conductive body uniformly closer and uniformly increasing the capacitances of the photovoltaic cells.

10. The fault diagnosis method of claim 9, wherein the conductive body has conductive substance in a periodic arrangement, or the conductive body has conductive substance in an arrangement with the same translation symmetry with that of arrangement of pluralities of photovoltaic cells, and
wherein, in the aligning, the alignment unit increases capacitance between the conductive body and the photovoltaic modules by bringing the conductive body and the photovoltaic modules closer so that such amount of conductive substance is included in each of cell spaces that cause uniform capacitance between the conductive body and each of the photovoltaic cells, the cell spaces being formed when acceptance surfaces of the photovoltaic cells are translated perpendicular to the acceptance surfaces.

11. The fault diagnosis method of claim 10, wherein the pluralities of photovoltaic cells are aligned in the same plane,
wherein the conductive body is a metal plate, and
wherein, in the aligning, the alignment unit brings the metal plate and the photovoltaic modules closer with the metal plate and the pluralities of photovoltaic cells parallel to increase capacitance between the conductive body and the photovoltaic modules.

12. The fault diagnosis method of claim 8, wherein the capacitance occurs uniformly in the photovoltaic modules, and
wherein, in the aligning, the alignment unit brings the conductive body and a site of the photovoltaic modules where small capacitance occurs to increase capacitance of the site.

13. The fault diagnosis method of claim 7, wherein the conductive body is grounded.

14. The fault diagnosis method of claim 7, wherein the fault diagnosis system further includes:
an attenuator for attenuating signal transferred in the photovoltaic modules not to cause reflection when connected to the photovoltaic modules;
a switching unit for switching connection between the positive terminal or the negative terminal and the signal generator or the attenuator; and
a switch controlling unit for controlling connection behavior of the switching unit,
wherein the fault diagnosis method further comprises:
first controlling, by the switch controlling unit, before the generating and inputting, the switching unit to connect one of the positive terminal and the negative terminal to the signal generator and not to connect the attenuator either the positive terminal or the negative terminal; and
determining, by the reflected wave analyzing unit, after the observing and before the computing, positive terminal reflection time, which is amount of time from inputting the positive terminal input signal to observing the positive terminal output signal, and negative terminal reflection time, which is amount of time from inputting the negative terminal input signal to observing the positive terminal output signal, by analyzing a reflected wave of an input signal inputted by the signal generator, and by analyzing a reflected wave of an input signal inputted by the signal generator when the switch controlling unit controls the switching unit to connect the other terminal to the signal generator and not to connect the attenuator either the positive terminal or the negative terminal,
wherein, if the positive terminal reflection time and the negative terminal reflection time are determined to be different in the determining, the diagnosis unit estimates the distance from the positive terminal or from the negative terminal to the fault location based on the positive terminal reflection time and the negative terminal reflection time, and
wherein, if the positive terminal reflection time and the negative terminal reflection time are determined to be equivalent in the determining, the fault diagnosis method further comprises after the determining and before the computing:
second controlling, by the switch controlling unit, the switching unit to connect a terminal, opposite to a terminal which is connected to the signal generator, to the attenuator; and
judging, by the reflected wave analyzing unit, whether reflection is caused or not, based on observation by the waveform observer, of a reflected wave of an input signal inputted by the signal generator,
wherein, if the reflection is judged to be caused in the judging, the diagnosis unit, in the estimating, estimates the distance from the positive terminal or from the negative terminal to the fault location based on the positive terminal reflection time and the negative terminal reflection time, and
wherein, if the reflection is determined not to be caused in the judging, the diagnosis unit, in the estimating, diagnoses the photovoltaic string as normal.

15. A non-transitory computer-readable medium storing a program that causes a computer to execute the fault diagnosis method of claim 7.

16. A device under test which is diagnosed by a fault diagnosis device for diagnosing a photovoltaic module by estimating a fault location of the photovoltaic module, comprising:
the photovoltaic module; and
a conductive body, different from the photovoltaic module, for causing capacitance with the photovoltaic module
wherein the fault diagnosis device includes a computing unit for estimating the fault location of the photovoltaic module whose capacitance is controlled by the conductive body, based on a positive terminal output signal which is a reflected wave of an input signal into the photovoltaic module when the fault diagnosis device is connected not to a negative terminal but to a positive terminal of the photovoltaic module and based on a negative terminal output signal which is a reflected wave of an input signal into the photovoltaic module when the fault diagnosis device is connected not to a positive terminal but to a negative terminal of the photovoltaic module.

17. A fault diagnosis device for diagnosing a photovoltaic array having a photovoltaic string having pluralities of photovoltaic modules connected in series by estimating a fault location of the photovoltaic array, comprising:
a computing unit for estimating the fault location of the photovoltaic string based on the string length or the number of the photovoltaic modules and based on a comparison result between two reflected waves observed by a waveform observer of two input signals inputted by a signal generator when the signal generator is connected to a positive terminal and when the signal generator is connected to a negative terminal.

18. The fault diagnosis system of claim 17,
wherein the photovoltaic array has pluralities of the photovoltaic strings connected in parallel, and
wherein the fault diagnosis system further comprises a relay unit for switching connection between the signal generator and any of the pluralities of the photovoltaic strings so that only a photovoltaic string under test is connected to the signal generator.

19. The fault diagnosis system of claim 17, further comprising a memory unit for storing a string length which is distance between a positive terminal and a negative terminal of the photovoltaic string or number of the photovoltaic modules.

* * * * *